United States Patent
Sakiyama et al.

(10) Patent No.: US 7,808,295 B2
(45) Date of Patent: Oct. 5, 2010

(54) MULTIPHASE LEVEL SHIFT SYSTEM

(75) Inventors: Shiro Sakiyama, Kyoto (JP); Akinori Matsumoto, Osaka (JP); Takashi Morie, Osaka (JP); Shiro Dosho, Osaka (JP); Yusuke Tokunaga, Hyogo (JP)

(73) Assignee: Panasonic Corporation, Osaka (JP)

( * ) Notice: Subject to any disclaimer, the term of this patent is extended or adjusted under 35 U.S.C. 154(b) by 208 days.

(21) Appl. No.: 12/296,021

(22) PCT Filed: Jun. 15, 2007

(86) PCT No.: PCT/JP2007/062125
§ 371 (c)(1),
(2), (4) Date: Oct. 3, 2008

(87) PCT Pub. No.: WO2008/059631
PCT Pub. Date: May 22, 2008

(65) Prior Publication Data
US 2009/0134931 A1    May 28, 2009

(30) Foreign Application Priority Data
Nov. 17, 2006  (JP)  ............................ 2006-312041

(51) Int. Cl.
*H03L 5/00* (2006.01)
*H03F 3/66* (2006.01)

(52) U.S. Cl. .................. 327/333; 327/299; 327/115; 327/258; 327/251; 331/57; 331/51

(58) Field of Classification Search ............ 327/333, 327/299, 115, 251, 258; 331/57, 51
See application file for complete search history.

(56) References Cited

U.S. PATENT DOCUMENTS

| | | | | |
|---|---|---|---|---|
| 5,592,126 A | * | 1/1997 | Boudewijns et al. | 331/45 |
| 6,933,791 B2 | * | 8/2005 | Chen | 331/45 |
| 6,954,506 B2 | * | 10/2005 | Cho | 375/321 |
| 6,967,512 B2 | * | 11/2005 | Kozaki | 327/144 |
| 7,126,432 B2 | * | 10/2006 | Roubadia et al. | 331/57 |
| 7,323,918 B1 | * | 1/2008 | Tai | 327/158 |
| 7,339,439 B2 | * | 3/2008 | Roubadia et al. | 331/57 |
| 7,679,459 B2 | * | 3/2010 | Menolfi et al. | 331/57 |
| 2003/0080783 A1 | * | 5/2003 | Kozaki | 327/22 |
| 2004/0104756 A1 | | 6/2004 | Payne | |

(Continued)

FOREIGN PATENT DOCUMENTS

JP        51-1377 B        1/1976

(Continued)

*Primary Examiner*—Vibol Tan
(74) *Attorney, Agent, or Firm*—McDermott Will & Emery LLP

(57) ABSTRACT

Each of n level shifters (LS0 to LS7) includes an NMOS transistor (Mn1) for receiving any one of n clock signals (P0 to P7) and a PMOS transistor (Mp1) for receiving an output signal from another level shifter. An output signal given to the PMOS transistor (Mp1) included in each of the level shifters (LS0 to LS7) is an output signal of the level shifter which receives the clock signal whose phase delay amount with respect to the clock signal given to the NMOS transistor (Mn1) included in that level shifter is a phase amount X (0°<X<180°). The phase amounts X of the n level shifters (LS0 to LS7) are equal to each other.

14 Claims, 24 Drawing Sheets

U.S. PATENT DOCUMENTS

2004/0140829 A1    6/2004  Noguchi et al.
2006/0197614 A1*   9/2006  Roubadia et al. ............... 331/57
2009/0015306 A1*   1/2009  Yoshizawa et al. .......... 327/231
2009/0167373 A1*   7/2009  Song .......................... 327/115
2009/0179681 A1*   7/2009  Nakamura et al. .......... 327/299

FOREIGN PATENT DOCUMENTS

JP         2000-307397         2/2000

* cited by examiner

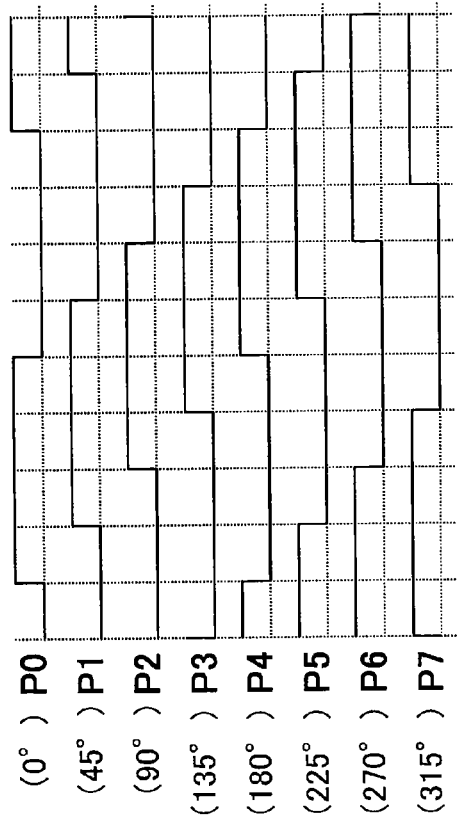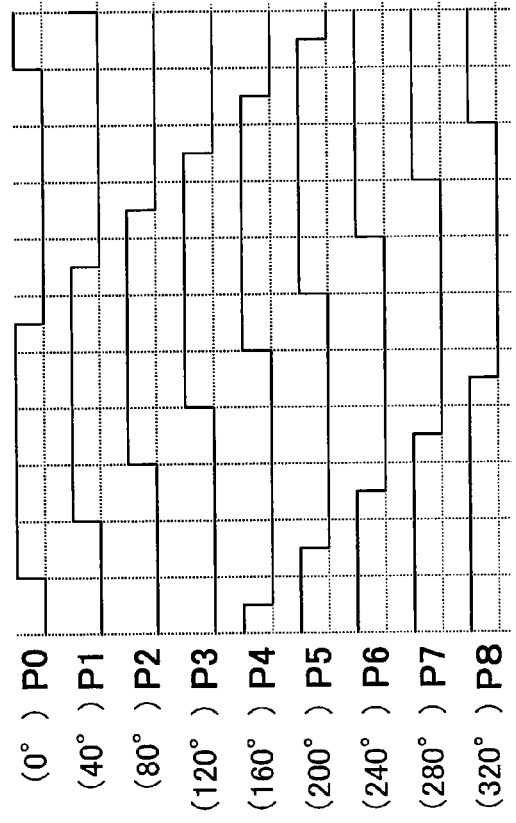
FIG.20A
FIG.20B

MULTIPHASE LEVEL SHIFT SYSTEM

RELATED APPLICATIONS

This application is the US National Phase under 35 U.S.C. §371 of International Application No. PCT/JP2007/062125 filed on Jun. 15, 2007, which claims the benefit of Japanese Application Nos. JP2006-312041, the disclosures of which Applications are incorporated by reference herein.

TECHNICAL FIELD

The present invention relates to a system for performing voltage conversion with respect to a given signal and, more particularly, to a system for performing voltage conversion with respect to input amplitudes of clock signals having multiple phases.

BACKGROUND ART

Clock signals having multiple phases are used for a write control of DVD or the like or high-speed communication (DDR, QDR, ODR, etc.). In general, the clock signals having multiple phases are generated using, for example, a phase locked loop (PLL) including a phase detector (PD), a charge pump (CP), a low-pass filter (LPF), and an oscillation circuit (a voltage controlled oscillator (VCO), a current controlled oscillator (CCO)). For example, clock signals P0 to P7 having eight phases as shown in FIG. 20A or clock signals P0 to P8 having nine phases as shown in FIG. 20B are generated. Also, the voltage level of a clock signal generated by the oscillation circuit is typically lower than the voltage level of a power supply, and therefore, a level shifter for converting the voltage level of the clock signal into the voltage level of the power supply is required.

FIG. 21A shows a configuration of a general level shifter. In the general level shifter LS90, the gate of an NMOS transistor Mn8 receives a clock signal P(+), and the gate of an NMOS transistor Mn9 receives a clock signal P(−). The phase difference between the clock signal P(+) and the clock signal P(−) is 180°. Also, the gate of a PMOS transistor Mp8 receives a voltage (output signal Q(−)) at a connection point of the transistors Mn9 and a transistor Mp9, and the gate of the PMOS transistor Mp9 receives a voltage (output signal Q(+)) at a connection point of the transistors Mn8 and Mp8. The output signal Q(+) corresponds to the clock signal P(+), and the output signal Q(−) corresponds to the clock signal P(−).

FIG. 21B is a waveform diagram for describing an operation of the level shifter LS90 of FIG. 21A. In the level shifter LS90, when the clock signal P(+) rises, the voltage value of the output signal Q(+) starts decreasing, and when the output signal Q(+) becomes lower than or equal to a threshold voltage ΔVt, the voltage value of the output signal Q(−) starts increasing. Also, when the clock signal P(−) rises, the voltage value of the output signal Q(−) starts decreasing, and when the output signal Q(−) becomes lower than or equal to the threshold voltage ΔVt, the voltage value of the output signal Q(+) starts increasing.

Here, attention is paid to the NMOS transistor Mn8 and the PMOS transistor Mp8. A drive period Ton(n) of the NMOS transistor Mn8 is a period from a rising edge to a falling edge of the clock signal P(+), and a drive period of the PMOS transistor Mp8 is a period from a falling edge to a rising edge of the output signal Q(−).

(Voltage Conversion of Clock Signals Having Even Number of Phases)

When voltage conversion is performed with respect to the clock signals P0 to P7 having eight phases (even number of phases), since there are four pairs of clock signals having a phase difference of 180°, four level shifters LS90a are required as shown in FIG. 22. Specifically, the four level shifters LS90a each receive any one of the clock signals P0 to P3 as the clock signal P(+), and one of the clock signals P4 to P7 that has a phase difference of 180° with respect to the clock signal P(+), as the clock signal P(−). Thereby, output signals Q0 to Q7 corresponding to the clock signals P0 to P7 are output.

(Voltage Conversion of Clock Signals Having Odd Number of Phases)

On the other hand, when voltage conversion is performed with respect to the clock signals P0 to P8 having nine phases (odd number of phases), since there are no clock signals having a phase difference of 180°, inverted clock signals (−P0) to (−P8) as shown in FIG. 23B having nine phases which have a phase difference of 180° with respect to the respective clock signals having nine phases need to be generated using a phase conversion circuit as shown in FIG. 23A. In this case, as shown in FIG. 24, nine level shifters LS90b are required. Specifically, the nine level shifters LS90b each receive any one of the clock signals P0 to P8 as the clock signal P(+), and an inverted clock signal having a phase difference of 180° with respect to the clock signal P(+), as the clock signal P(−). Thereby, output signals Q0 to Q8 corresponding to the clock signals P0 to P8 are output.

Patent Document 1: Japanese Unexamined Patent Application Publication No. 2000-307397

DISCLOSURE OF THE INVENTION

Problems to be Solved by the Invention

However, in conventional level shifters, an ON period (current extraction period) of the NMOS transistor Mn8 and an ON period (current supply period) of the PMOS transistor Mp8 overlap each other, so that a through current from a power supply node to a ground node occurs, leading to an increase in power consumption. The overlapping of the ON periods of both the transistors also equivalently reduces the drive ability when the NMOS transistor Mn8 is in the ON state, so that the through rate of falling of the voltage value of the output signal is deteriorated, resulting in a deterioration in phase precision of the output signal.

An object of the present invention is to suppress the occurrence of a through current in a level shifter.

Solution to the Problems

According to the present invention, a multiphase level shift system is provided for performing voltage conversion with respect to output voltages of n clock signals (n is an integer of three or more) having equal cycles, an interval between phases thereof being a phase amount T (T=360°/n). The system includes n level shifters in a one-to-one correspondence with the n clock signals. The each of the n level shifters includes a first NMOS transistor and a first PMOS transistor. The first NMOS transistor included in each of the n level shifters is connected between an output node for outputting an output signal of said level shifter and a ground node, and a gate of the first NMOS transistor receives the clock signal corresponding to said level shifter. The first PMOS transistor included in each of the n level shifters is connected between the output node and a power supply node, and a gate of the first PMOS transistor receives an output signal from another level shifter different from said level shifter. The output signal given to the gate of the first PMOS transistor included in each of the n level shifters is an output signal of the level shifter which receives the clock signal delayed by a phase amount X (0°<X<180°) from the clock signal given to the gate of the first NMOS transistor included in said level shifter. The phase amounts X of the n level shifters are equal to each other.

In the multiphase level shift system, the overlapping of a period during which a current is extracted from the output node to the ground node (current extraction period) and a period during which a current flows from the power supply node to the output node (current supply period) can be eliminated. Thereby, the occurrence of a through current in each level shifter can be suppressed, so that power consumption can be reduced. Also, the phase precision of the output signal with respect to the clock signal can be improved.

Also, each of the n level shifters further includes a delay element for delaying an output of said level shifter. A falling delay amount in each of the n level shifter is a phase amount LSf, and a rising delay amount in said level shifter is a phase amount LSr. A falling delay amount DDf in the delay element included in each of the n level shifters is (DDf≧180°−LSf−X), and a rising delay amount DDR in said delay element is (DDR≦180°−LSr−X).

In the multiphase level shift system, the occurrence of a through current can be suppressed by adjusting a delay amount in the delay element. Therefore, the multiphase level shift system can be easily constructed without changing the design of the level shifter.

Preferably, the falling delay amount DDf in the delay element included in each of the n level shifters is larger than the falling delay amount DDR of said delay element.

In the multiphase level shift system, the possible range of the phase amount X is broadened, so that the multiphase level shift system capable of suppressing the occurrence of a through current can be easily constructed.

Preferably, a falling edge of the output signal given to the gate of the first PMOS transistor included in each of the n level shifters occurs subsequent in time to or simultaneously with a falling edge of the clock signal given to the gate of the first NMOS transistor included in said level shifter, and a rising edge of the output signal given to the gate of said first PMOS transistor occurs prior in time to or simultaneously with a rising edge of said clock signal.

In the multiphase level shift system, the first PMOS transistor goes into the non-drive state when a rising edge of the output signal occurs, and goes into the drive state when a falling edge of the output signal occurs. Also, the first NMOS transistor goes into the drive state when a rising edge of the clock signal occurs, and goes into the non-drive state when a falling edge of the clock signal occurs. In other words, the first NMOS transistor goes into the non-drive state before (or at the same time) the first PMOS transistor goes into the drive state, and the first PMOS transistor goes into the non-drive state before (or at the same time) the first NMOS transistor goes into the drive state.

Also, each of the n level shifters further includes a second PMOS transistor. The second PMOS transistor included in each of the n level shifters and the first PMOS transistor included in said level shifter are connected in series between the power supply node and the output node, and a gate of said second PMOS transistor receives the output signal of another level shifter different from said level shifter. The output signal given to the gate of the second PMOS transistor included in each of the n level shifters is an output signal of the level shifter corresponding to the clock signal delayed by a phase amount Y (X<Y<360°−X) from the clock signal given to the first NMOS transistor included in said level shifter. The phase amounts Y of the n level shifters are equal to each other.

In the multiphase level shift system, when both the first and second PMOS transistors go into the drive state, a current is supplied from a power supply node to the output node. In other words, a period during which both the first and second PMOS transistors are in the drive state is a current supply period. Also, the overlapping of the current extraction period and the current supply period can be eliminated, so that the occurrence of a through current can be suppressed in each level shifter. Further, the duty ratio of the output signal can be adjusted by adjusting the phase amount Y.

Preferably, a falling edge of the output signal given to the gate of the second PMOS transistor included in each of the n level shifters occurs subsequent in time to or simultaneously with a falling edge of the clock signal given to the gate of the first NMOS transistor included in said level shifter, and a rising edge of the output signal given to the gate of the first PMOS transistor included in said level shifter occurs prior in time to or simultaneously with a rising edge of said clock signal.

In the multiphase level shift system, the second PMOS transistor goes into the drive state when a falling edge of the output signal occurs, and goes into the non-drive state when a rising edge of the output signal occurs. Also, the first NMOS transistor goes into the non-drive state before (or at the same time) both the first and second PMOS transistors goes into the drive state, and at least one of the first and second PMOS transistors goes into the non-drive state before (or at the same time) the first NMOS transistor goes into the drive state.

Also, each of the n level shifters further includes a second NMOS transistor. The second NMOS transistor included in each of the n level shifters and the first NMOS transistor included in said level shifter are connected in series between the ground node and the output node, and a gate of said second NMOS transistor receives another clock signal different from the clock signal given to said first NMOS transistor. The clock signal given to the second NMOS transistor included in each of the n level shifters is advanced by a phase amount Z (0°<Z<180°) from the clock signal given to the gate of the first NMOS transistor included in said level shifter. The phase amounts Z of the n level shifters are equal to each other.

In the multiphase level shift system, when both the first and second NMOS transistors go into the drive state, a current is extracted from the output node to the ground node. In other words, a period during which both the first and second NMOS transistors are in the drive state is the current extraction period. Also, the overlapping of the current extraction period and the current supply period can be eliminated, so that the occurrence of a through current can be suppressed.

Preferably, a falling edge of the output signal given to the gate of the first PMOS transistor included in each of the n level shifters occurs subsequent in time to or simultaneously with a falling edge of the clock signal given to the gate of the second NMOS transistor included in said level shifter, and a rising edge of the output signal given to the gate of said first PMOS transistor occurs prior in time to or simultaneously with a rising edge of the clock signal given to the gate of the first NMOS transistor included in said level shifter.

In the multiphase level shift system, the second NMOS transistor goes into the drive state when a rising edge of the clock signal occurs, and goes into the non-drive state when a falling edge of the clock signal occurs. Also, at least one of the first and second PMOS transistors goes into the non-drive state before (or at the same time) the first PMOS transistor goes into the drive state, and the first PMOS transistor goes into the non-drive state before (or at the same time) both the first and second NMOS transistors go into the drive state.

Also, each of the n level shifters further includes a resistance element. One end of the resistance element included in each of the n level shifters is connected to the output node of said level shifter, and the other end of said resistance element is connected to the output node of another level shifter different from said level shifter. The output node connected to the other end of the resistance element included in each of the n level shifters is the output node of the level shifter corresponding to the clock signal delayed by the phase amount T from the clock signal corresponding to said level shifter.

In the multiphase level shift system, a phase variation of the output signal in each level shifter is interpolated using adjacent phases, so that the phase precision of the output signal can be further improved.

Also, a multiphase level shift system includes n level shifters in a one-to-one correspondence with the n clock signals, and n resistance elements in a one-to-one correspondence with the n level shifters. Each of the n level shifters performs voltage conversion with respect to the clock signal corresponding to said level shifter to generate an output signal corresponding to said clock signal, and outputs said output signal from an output node. One end of each of the n resistance elements is connected to the output node of the level shifter corresponding to said resistance element, and the other end of said resistance element is connected to the output node of another level shifter different from the level shifter corresponding to said resistance element. The output node connected to the other end of each of the n resistance elements is the output node of the level shifter corresponding to the clock signal delayed by the phase amount T from the clock signal corresponding to the level shifter connected to the one end of said resistance element.

In the multiphase level shift system, a phase variation of the output signal in each level shifter is interpolated using adjacent phases, so that the phase precision of the output signal can be further improved.

Effect of the Invention

As described above, the occurrence of a through current can be suppressed in each level shifter, so that power consumption can be reduced. Also, the phase precision of the output signal with respect to the clock signal can be improved.

BRIEF DESCRIPTION OF THE DRAWINGS

FIG. 20A is a waveform diagram showing clock signals having eight phases. FIG. 20B is a waveform diagram showing clock signals having nine phases.

DESCRIPTION OF THE REFERENCE CHARACTERS

Figure 1:
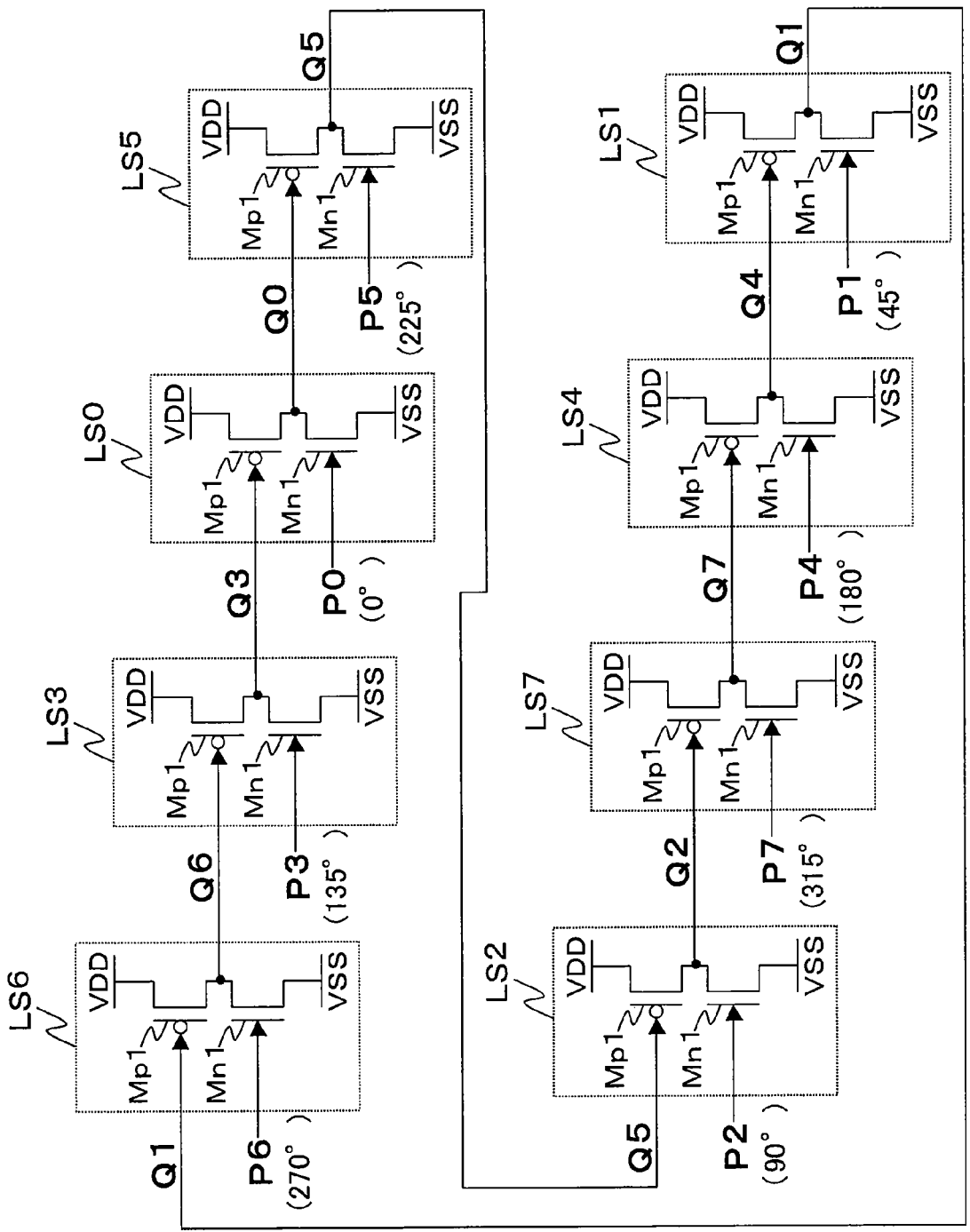
FIG. 1 is a circuit diagram showing an exemplary configuration of a multiphase level shift system according to a first embodiment of the present invention.

LS0 to LS7, LS50 to LS57 level shifter
Mn1 NMOS transistor (first NMOS transistor)
Mp1 PMOS transistor (first PMOS transistor)
DD delay element
Mp2 PMOS transistor (second PMOS transistor)
Mn2 NMOS transistor (second NMOS transistor)
RR, RR1 to RR7 resistance element

BEST MODE FOR CARRYING OUT THE INVENTION

Hereinafter, embodiments of the present invention will be described in detail with reference to the accompanying drawings. Note that the same or like parts are indicated by the same reference numerals and will not be repeatedly described.

First Embodiment

<Multiphase Level Shift System>

FIG. 1 shows a whole configuration of a multiphase level shift system according to a first embodiment of the present invention. The multiphase level shift system performs voltage conversion with respect to output amplitudes of n clock signals (n is an integer of three or more) to output n output signals corresponding to the respective n clock signals. In other words, a phase relationship between the n output signals corresponds to a phase relationship between the n clock signals. The n clock signals have a phase interval T of 360°/n. This system includes n level shifters in a one-to-one correspondence with the n clock signals. Note that a case where "n=8" is shown in FIG. 1. The clock signals P0 to P7 have the following phases.

| | |
|---|---|
| Clock signal P0: | zeroth phase (0°) |
| Clock signal P1: | first phase (45°) |
| Clock signal P2: | second phase (90°) |
| Clock signal P3: | third phase (135°) |
| Clock signal P4: | fourth phase (180°) |
| Clock signal P5: | fifth phase (225°) |
| Clock signal P6: | sixth phase (270°) |
| Clock signal P7: | seventh phase (315°) |

<Configuration of Level Shifters>

The level shifters LS0 to LS7 each include an NMOS transistor Mn1 and a PMOS transistor Mp1. The source of the NMOS transistor Mn1 is connected to a ground node which receives a ground potential VSS, the source of the PMOS transistor Mp1 is connected to a power supply node which receives a power supply potential VDD, and the drains of the NMOS transistor Mn1 and the PMOS transistor Mp1 are connected to each other. A voltage at a connection point (output node) of the NMOS transistor Mn1 and the PMOS transistor Mp1 is output as an output signal of the level shifter.

In each of the level shifters LS0 to LS7, the gate of the NMOS transistor Mn1 receives a clock signal corresponding to the level shifter. On the other hand, the gate of the PMOS transistor Mp1 receives an output signal of a level shifter corresponding to a clock signal delayed by a phase amount X (0°<X<180°) from the clock signal given to the NMOS transistor Mn1. Also, the level shifters all have the same phase amount X. Note that X=135° in FIG. 1.

<Phase Amount X in Each Level Shifter>

Figure 2:
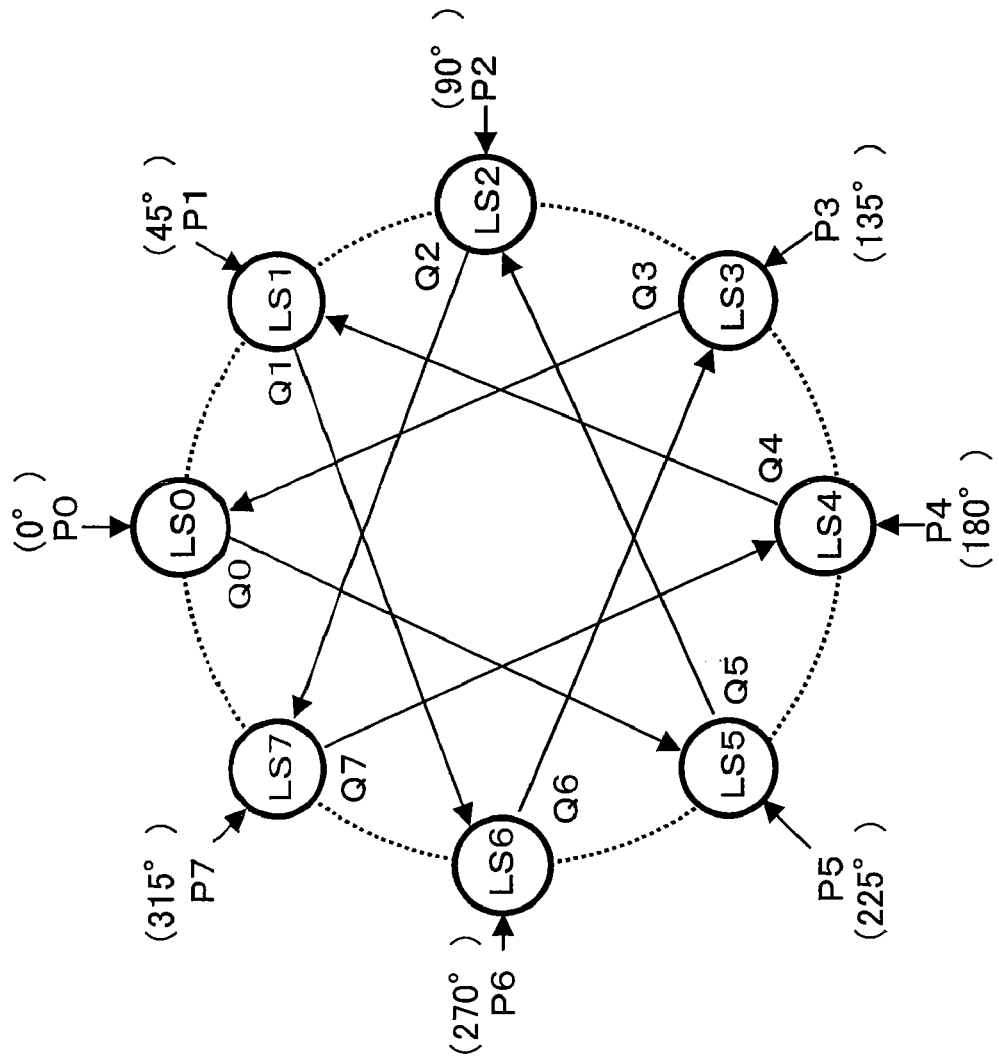
FIG. 2 is a conceptual diagram showing a phase relationship between a clock signal given to each level shifter of FIG. 1, and an output signal.

FIG. 2 shows a phase relationship between a clock signal given to the NMOS transistor Mn1 and an output signal given to the PMOS transistor Mp1 in each of the level shifters LS0 to LS7 of FIG. 1.

In a level shifter $LS_{(k)}$ corresponding to a clock signal $P_{(k)}$ having a $k^{th}$ phase, the NMOS transistor Mn1 receives the clock signal $P_{(k)}$, and the PMOS transistor Mp1 receives an output signal $Q_{(k+\alpha)}$ from a level shifter $LS_{(k+\alpha)}$ corresponding to a clock signal $P_{(k+\alpha)}$. The clock signal $P_{(k+\alpha)}$ is delayed by the phase amount X from the clock signal $P_{(k)}$. Here, "k" is an integer of zero or more and $0 \leq k \leq n-1$, and "$\alpha$" is an integer and $\alpha = X/T$ (T is a phase interval of clock signals). Note that, when $(k+\alpha) > (n-1)$, $(k+\alpha)$ is a remainder which is left when $(k+\alpha)$ is divided by n. In FIG. 2, n=8, and $\alpha = 135°/45° = 3$.

<Operation>

Figure 3:
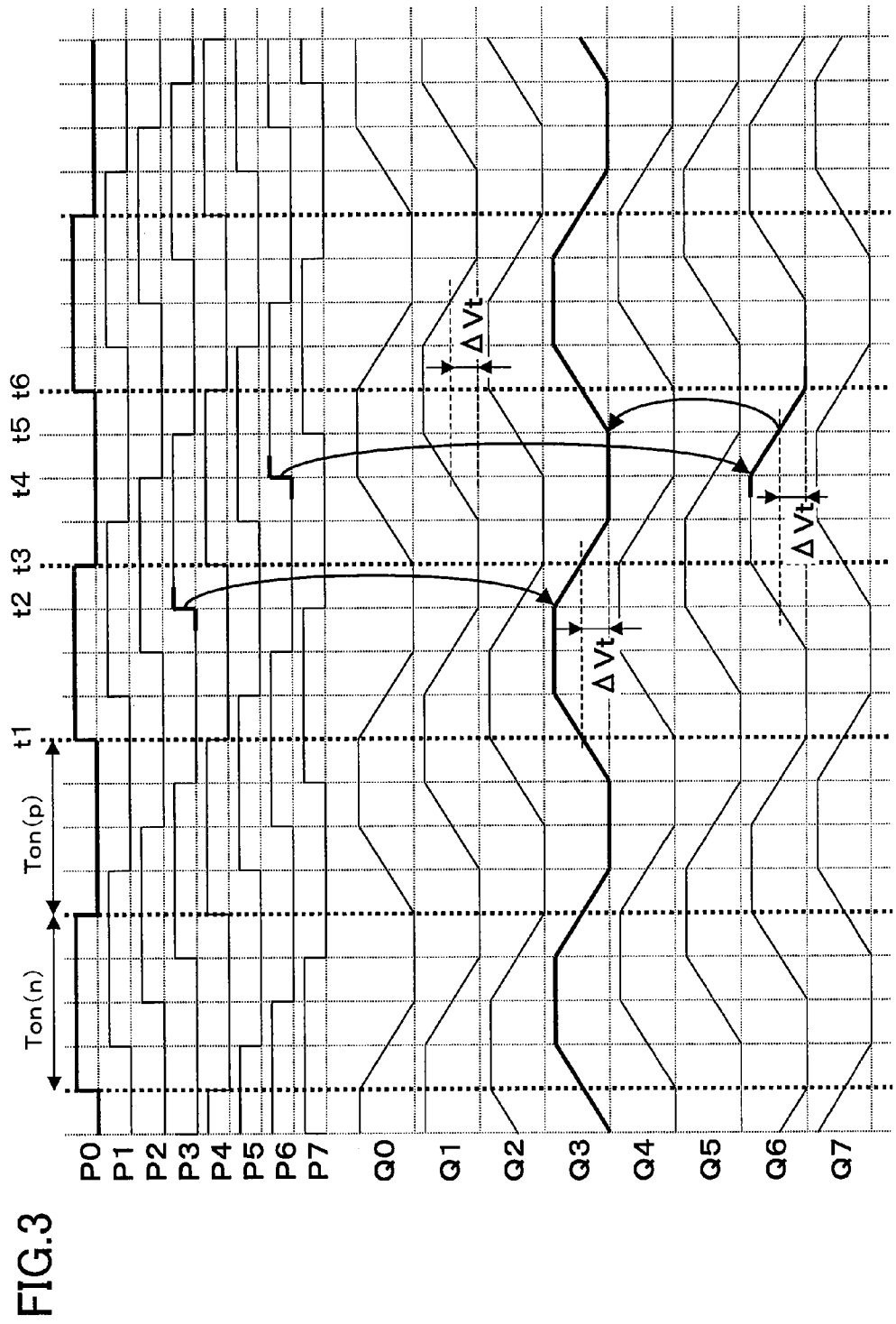
FIG. 3 is a signal waveform diagram for describing an operation of the multiphase level shift system of FIG. 1.

Next, an operation of the multiphase level shift system of FIG. 1 will be described with reference to FIG. 3. Note that, here, the PMOS transistor goes into a drive state (i.e., a state in which a current flows from the power supply node via the PMOS transistor to the output node) when the output signal becomes lower than or equal to a threshold voltage ΔVt of the PMOS transistor Mp1, and a non-drive state (i.e., a state in which a drain current does not occur in the PMOS transistor) when the output signal becomes higher than or equal to the threshold voltage ΔVt.

Also, a rising delay amount and a falling delay amount of each level shifter is assumed to be a phase amount "45°". The rising delay amount in a level shifter means a delay amount from the start of rising of the voltage value of the output signal until the output signal reaches the threshold voltage ΔVt (i.e., the PMOS transistor goes into the drive state). The falling delay amount in a level shifter means a delay amount from the start of falling of the voltage value of the output signal until the output signal reaches the threshold voltage ΔVt (i.e., the PMOS transistor goes into the non-drive state). For the sake of simplicity, it is assumed that the level shifters all have the same rising delay amount and the same falling delay amount.

(Starting of Driving of NMOS Transistor)

At time t1, in the level shifter LS0, the clock signal P0 rises, so that the NMOS transistor Mn1 goes into the drive state. Thereby, the voltage value of the output signal Q1 of the level shifter LS0 starts decreasing. Also, since the output signal Q3 to the level shifter LS0 is higher than the threshold voltage ΔVt, the PMOS transistor Mp1 is in the non-drive state.

(Decrease in Voltage of Output Signal Q3)

At time t2, in the level shifter LS3, the clock signal P3 rises, so that the NMOS transistor Mn1 goes into the drive state. Thereby, the voltage value of the output signal Q3 starts decreasing.

(Stopping of Driving of NMOS Transistor/Starting of Driving of PMOS Transistor)

At time t3, in the level shifter LS0, the clock signal P0 falls, so that the NMOS transistor Mn1 goes into the non-drive state. On the other hand, the output signal Q3 becomes lower than or equal to the threshold voltage ΔVt, so that the PMOS transistor Mp1 goes into the drive state. Thereby, the voltage value of the output signal Q0 starts increasing.

(Increase in Voltage of Output Signal Q6)

At time t4, in the level shifter LS6, the clock signal P6 rises, so that the NMOS transistor Mn1 goes into the drive state. Thereby, the voltage value of the output signal Q6 starts decreasing.

(Increase in Voltage of Output Signal Q3)

At time t5, in the level shifter LS3, the output signal Q6 becomes lower than or equal to the threshold voltage ΔVt, so that the PMOS transistor Mp1 goes into the drive state. Thereby, the voltage value of the output signal Q3 starts increasing.

(Stopping of Driving of PMOS Transistor/Starting of Driving of NMOS Transistor)

At time t6, in the level shifter LS0, the output signal Q3 becomes higher than or equal to the threshold voltage ΔVt, so that the PMOS transistor Mp1 goes into the non-drive state. On the other hand, the clock signal P0 rises, so that the NMOS transistor Mn1 goes into the drive state. Thereby, the voltage value of the output signal Q0 starts decreasing.

Thus, in each of the level shifters LS0 to LS7, the PMOS transistor Mp1 goes into the drive state, and at the same time, the NMOS transistor Mn1 goes into the non-drive state, and the NMOS transistor Mn1 goes into the drive state, and the same time, the PMOS transistor Mp1 goes into the non-drive state. In other words, a drive period Ton(n) of the NMOS transistor Mn1 and a drive period Ton(p) of the PMOS transistor Mp1 do not overlap each other.

<Non-Overlapping Conditions>

Figure 4A:
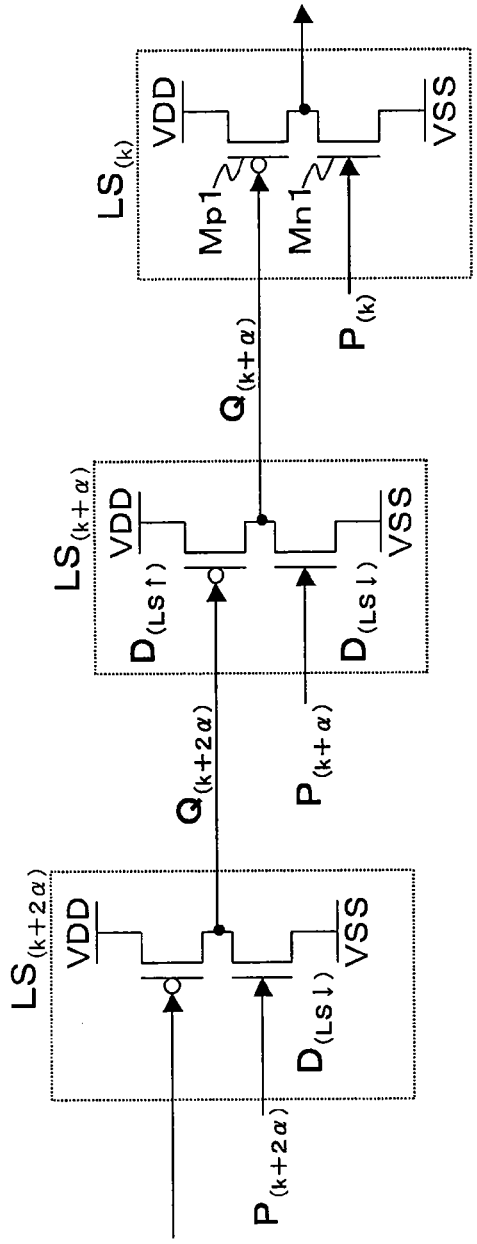
FIG. 4A is a schematic diagram for describing non-overlapping conditions in the multiphase level shift system of the first embodiment.
Figure 4B:
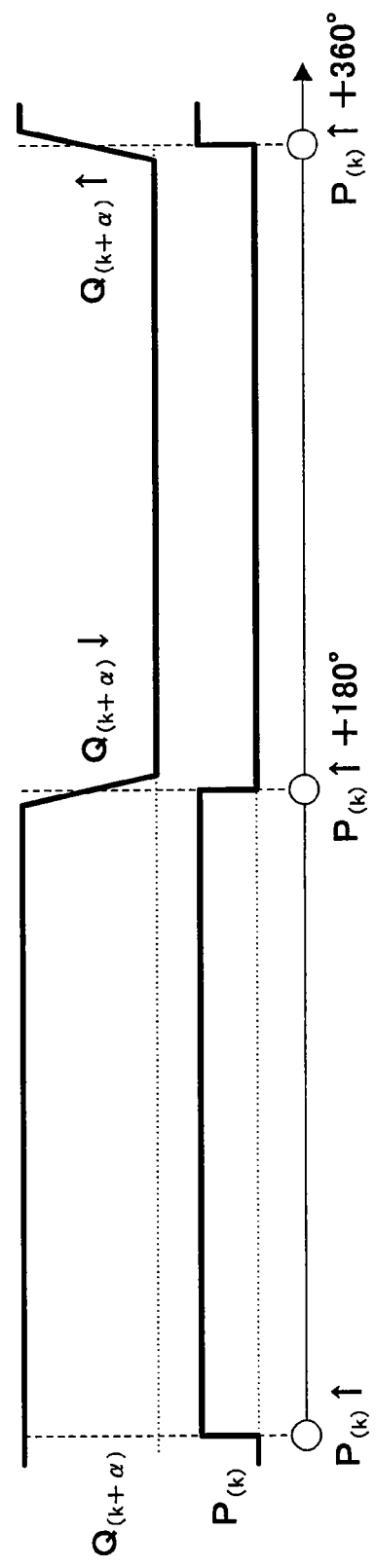
FIG. 4B is a waveform diagram showing a phase relationship between a clock signal and an output signal when the non-overlapping conditions are satisfied.

Here, with reference to FIG. 4, conditions under which, in each level shifter of this embodiment, current extraction from the output node to the ground node is stopped before (or at the same time) current supply from the power supply node to the output node is started, and current extraction from the output node to the ground node is started after (or at the same time) current supply from the power supply node to the output node is stopped (i.e., conditions under which the current extraction period and the current supply period do not substantially overlap each other: non-overlapping conditions), will be described. Here, the level shifters $LS_{(k)}$, $LS_{(k+\alpha)}$, and $LS_{(k+2\alpha)}$ will be described as an example.

Note that, in the following description, the rising delay amount and the falling delay amount in each level shifter are considered as "phase amounts", but not "time amounts". Also, a rising edge of the clock signal $P_{(k)}$ (an initial phase of the clock signal $P_{(k)}$) is assumed as a phase reference point (0°), while rising edges of the other clock signals (initial phases of the other clock signals) and a rising edge and a falling edge of the output signal are each represented by a phase amount from the rising edge of the clock signal $P_{(k)}$.

Firstly, symbols used in the drawings and the following expressions will be described.

<<Clock Signals>>

$P_{(k)}$: a clock signal having a $k^{th}$ phase
$P_{(k+\alpha)}$: a clock signal having a $(k+\alpha)^{th}$ phase
$P_{(k+2\alpha)}$: a clock signal having a $(k+2\alpha)^{th}$ phase <<Output Signals>>

$Q_{(k+\alpha)}$: an output signal of the level shifter $LS_{(k+\alpha)}$
$Q_{(k+2\alpha)}$: an output signal of the level shifter $LS_{(k+2\alpha)}$ <<Delay Amounts>>

$D_{(LS\uparrow)}$: a rising delay amount in each level shifter
$D_{(LS\downarrow)}$: a falling delay amount in each level shifter
$D_{(LS\uparrow)}>0°$, $D_{(LS\downarrow)}>0°$ <<Signal Edges>>

↑: a rising edge of a signal
↓: a falling edge of a signal

<<Phase Relationships>>

$P_{(k)}\uparrow < P_{(k+\alpha)}\uparrow < P_{(k+2\alpha)}\uparrow < (P_{(k)}\uparrow + 360°)$ $P_{(k)}\downarrow = P_{(k)}\uparrow + 180°$ <<Phase Amount X>>

$P_{(k+\alpha)}\uparrow - P_{(k)}\uparrow = P_{(k+2\alpha)}\uparrow - P_{(k+\alpha)}\uparrow = X$ $P_{(k+2\alpha)}\uparrow - P_{(k)}\uparrow = 2\cdot(P_{(k+\alpha)}\uparrow - P_{(k)}\uparrow) = 2X$ $P_{(k+\alpha)}\uparrow - P_{(k)}\uparrow > 0° \Rightarrow X > 0°$ The phase amount X which is the phase delay amount of the clock signal $P_{(k+\alpha)}$ with respect to the clock signal $P_{(k)}$ is defined as in the above-described expression. Also, the phase delay amount of the clock signal $P_{(k+2\alpha)}$ with respect to the clock signal $P_{(k+\alpha)}$ is equal to the phase delay amount of the clock signal $P_{(k+\alpha)}$ with respect to the clock signal $P_{(k)}$.

(Drive Period of Transistor)

In the level shifter $LS_{(k)}$, during a period from the rising edge $P_{(k)}\uparrow$ to the falling edge $P_{(k)}\downarrow$ of the clock signal $P_{(k)}$, the clock signal $P_{(k)}$ is at a high level (e.g., higher than or equal to the threshold voltage of the NMOS transistor Mn1), so that the NMOS transistor Mn1 is in the drive state, and therefore, a current is extracted from the output node to the ground node.

Also, during a period from the falling edge $Q_{(k+\alpha)}\downarrow$ to the rising edge $Q_{(k+\alpha)}\uparrow$ of the output signal $Q_{(k+\alpha)}$, the clock signal $Q_{(k+\alpha)}$ is lower than or equal to the threshold voltage $\Delta Vt$ of the PMOS transistor Mp1, so that the PMOS transistor Mp1 is in the drive state, and therefore, a current is supplied from the power supply node to the output node.

Therefore, in order to satisfy the non-overlapping conditions, the following expressions [Expression 1-1] and [Expression 1-2] need to be satisfied.

$P_{(k)}\downarrow \leq Q_{(k+\alpha)}\downarrow$ [Expression 1-1]

$Q_{(k+\alpha)}\uparrow \leq P_{(k)}\uparrow + 360°$ [Expression 1-2]

Specifically, the falling edge $Q_{(k+\alpha)}\downarrow$ of the output signal $Q_{(k+\alpha)}$ occurs subsequent in time to (or simultaneously with) the falling edge $P_{(k)}\downarrow$ of the clock signal $P_{(k)}$, and the rising edge $Q_{(k+\alpha)}\uparrow$ of the output signal $Q_{(k+\alpha)}$ occurs prior in time to (or simultaneously with) the rising edge of the clock signal $P_{(k)}$.

(Timing of Occurrence of Edge of Output Signal)

In the level shifter $LS_{(k+\alpha)}$, when the rising edge $P_{(k+\alpha)}\uparrow$ of the clock signal $P_{(k+\alpha)}$ occurs, the voltage value of the output signal $Q_{(k+\alpha)}$ starts decreasing. Also, when the falling edge $Q_{(k+2\alpha)}\downarrow$ of the output signal occurs, the voltage value of the output signal $Q_{(k+\alpha)}$ starts increasing. Further, in the level shifter $LS_{(k+2\alpha)}$, when the rising edge $P_{(k+2\alpha)}\uparrow$ of the clock signal $P_{(k+2\alpha)}$ occurs, the voltage value of the output signal $Q_{(k+2\alpha)}$ starts decreasing.

Here, taking into consideration the falling delay amount and the rising delay amount in each level shifter, the rising edge $Q_{(k+\alpha)}\uparrow$ and the falling edge $Q_{(k+\alpha)}\downarrow$ of the output signal $Q_{(k+\alpha)}$ are represented by [Expression 1-3] and [Expression 1-4].

$Q_{(k+\alpha)}\downarrow = P_{(k+\alpha)}\uparrow + D_{(LS\downarrow)}$ [Expression 1-3]

$Q_{(k+\alpha)}\uparrow = Q_{(k+2\alpha)}\downarrow + D_{(LS\uparrow)} = P_{(k+2\alpha)}\uparrow + D_{(LS\downarrow)} + D_{(LS\uparrow)}$ [Expression 1-4]

Specifically, the falling edge $Q_{(k+\alpha)}\downarrow$ of the output signal $Q_{(k+\alpha)}$ depends on the timing of occurrence of the rising edge $P_{(k+\alpha)}\uparrow$ of the clock signal $P_{(k+\alpha)}$, and the rising edge $Q_{(k+\alpha)}\uparrow$ of the output signal $Q_{(k+\alpha)}$ depends on the timing of occurrence of the rising edge $P_{(k+2\alpha)}\uparrow$ of the clock signal $P_{(k+2\alpha)}$.

(Phase Amount X)

(1) Initially, a lower limit value of the phase amount X is obtained. Here, [Expression 1-3] is substituted into [Expression 1-1].

Also, since $P_{(k)}\downarrow = P_{(k)}\uparrow + 180°$ and $P_{(k+2\alpha)}\uparrow - P_{(k+\alpha)}\uparrow = X$,

[Expression 1-1] $\Rightarrow P_{(k)}\uparrow + 180° \leq P_{(k+\alpha)}\uparrow + D_{(LS\downarrow)}$ $\Rightarrow P_{(k+\alpha)}\uparrow - P_{(k)}\uparrow \geq 180° - D_{(LS\downarrow)}$ $\Rightarrow X \geq 180° - D_{(LS\downarrow)}$ [Expression 1-5]

Thus, [Expression 1-5] is obtained.

(2) Next, an upper limit value of the phase amount X is obtained. Here, [Expression 1-4] is substituted into [Expression 1-2]. Also, since $P_{(k+2\alpha)}\uparrow - P_{(k)}\uparrow = 2X$,

[Expression 1-2] $\Rightarrow P_{(k+2\alpha)}\uparrow + D_{(LS\downarrow)} + D_{(LS\uparrow)} \leq P_{(k)}\uparrow + 360°$ $\Rightarrow P_{(k+2\alpha)}\uparrow - P_{(k)}\uparrow \leq 360° - D_{(LS\downarrow)} - D_{(LS\uparrow)}$ $\Rightarrow 2X \leq 360° - D_{(LS\downarrow)} - D_{(LS\uparrow)}$ [Expression 1-6]

Thus, [Expression 1-6] is obtained.

(3) Next, the range of the phase amount X is obtained. Here, according to [Expression 1-5] and [Expression 1-6], $180° - D_{(LS\downarrow)} \leq X \leq 180° - (1/2)\cdot(D_{(LS\downarrow)} + D_{(LS\uparrow)})$ [Expression 1-7]

Also, since $D_{(LS\downarrow)} > 0°$, $D_{(LS\uparrow)} > 0°$, and $X > 0°$, $0° < X < 180°$ [Expression 1-8]

Thus, [Expression 1-7] and [Expression 1-8] are obtained.

(4) As described above, if the phase amount X satisfies [Expression 1-7], the non-overlapping conditions can be satisfied. Also, the possible range of the phase amount X is represented by [Expression 1-8]. Specifically, although the possible range of the phase amount X varies depending on the falling delay amount and the rising delay amount of each level shifter, the phase amount X which can satisfies the non-overlapping conditions falls within the range represented by [Expression 1-8].

(Phase Delay Amounts $D_{(LS\downarrow)}$ and $D_{(LS\uparrow)}$ in Level Shifter)

Next, the falling delay amount ($D_{(LS\downarrow)}$) and the rising delay amount ($D_{(LS\uparrow)}$) of a level shifter are obtained.

[Expression 1-5] $\Rightarrow D_{(LS\downarrow)} \geqq 180° - X$      [Expression 1-9]

[Expression 1-6] $\Rightarrow D_{(LS\downarrow)}, D_{(LS\uparrow)} \leqq 360° - 2X$      [Expression 1-10]

By [Expression 1-9]-[Expression 1-10], $D_{(LS\uparrow)} \leqq 180° - X$      [Expression 1-11]

As described above, if the delay amount ($D_{(LS\downarrow)}$) during signal falling in the level shifter satisfies [Expression 1-9], and the delay amount ($D_{(LS\uparrow)}$) during signal rising in the level shifter satisfies [Expression 1-11], the level shifter can satisfy the non-overlapping conditions.

<Effect>

As described above, in each level shifter, current extraction from the output node can be stopped before (or at the same time) current supply to the output node is started, and current extraction from the output node can be started after (or at the same time) current supply to the output node is stopped (i.e., the overlapping of the current extraction period and the current supply period can be eliminated). Therefore, the occurrence of a through current flowing from the power supply node via the PMOS transistor and the NMOS transistor to the ground node can be suppressed. Thereby, power consumption of each level shifter can be reduced.

Also, since the current extraction period and the current supply period do not subsequently overlap, so that signal rising and falling are performed with high speed in each level shifter. In other words, the delay amount in each level shifter can be reduced. Thereby, the phase precision of the output signal with respect to the clock signal can be improved.

Note that the falling delay amount is preferably larger than the rising delay amount in a level shifter. In this case, the possible range of the phase amount X is broadened, so that the multiphase level shift system can be easily constructed.

Second Embodiment

<Whole Configuration>

Figure 5:
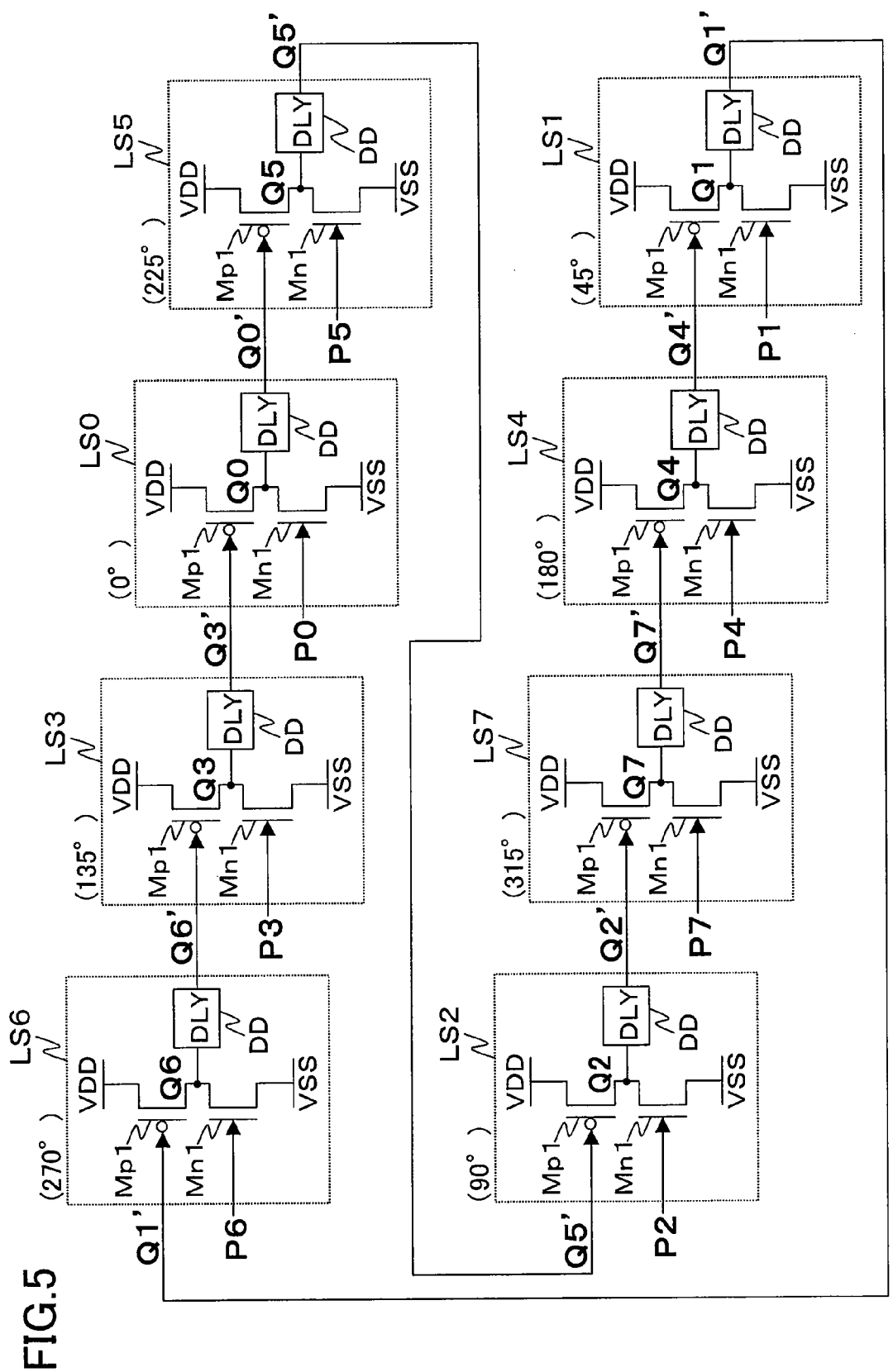
FIG. 5 is a circuit diagram showing an exemplary configuration of a multiphase level shift system according to a second embodiment of the present invention.

FIG. 5 shows a whole configuration of a multiphase level shift system according to a second embodiment of the present invention. In this system, level shifters LS0 to LS7 each further include a delay element DD in addition to the PMOS transistor Mp1 and the NMOS transistor Mn1 of FIG. 1. The delay element DD delays an output signal from a connection point (output node) of the NMOS transistor Mn1 and the PMOS transistor Mp1, and outputs the resultant signal as a delayed output signal. Also, a rising delay amount in the delay element DD and a falling delay amount in the delay element DD are different from each other.

<Internal Configuration of Delay Element>

Figure 6A:
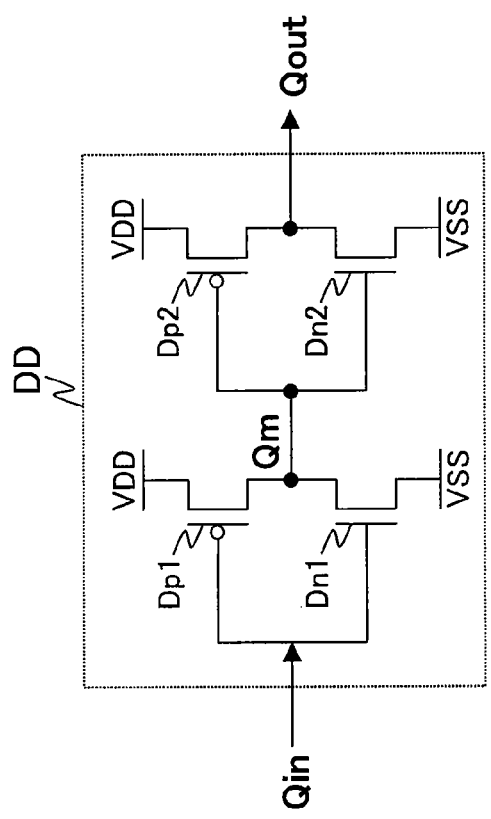
FIG. 6A is a circuit diagram showing an exemplary internal configuration of a delay element of FIG. 5.

FIG. 6A shows an exemplary internal configuration of the delay element DD of FIG. 5. The delay element DD includes PMOS transistors Dp1 and Dp2 and NMOS transistors Dn1 and Dn2. The transistors Dp1 and Dn1 are connected in series between a power supply node and a ground node, and the gate of each transistor receives a voltage (an output signal from an output node) Qin at a connection point of the transistors Mn1 and Mp1. The transistors Dp2 and Dn2 are connected in series between the power supply node and the ground node, and the gate of each transistor receives an intermediate output signal Qm from a connection point of the transistors Dp1 and Dn1. A voltage at a connection point between the transistors Dp2 and Dn2 is output as a delayed output signal Qout. Also, the drive ability of the PMOS transistor Dp1 is smaller than the drive ability of the NMOS transistor Dn1. On the other hand, the drive ability of the PMOS transistor Dp2 and the drive ability of the NMOS transistor Dn2 are assumed to be equal to each other.

Figure 6B:
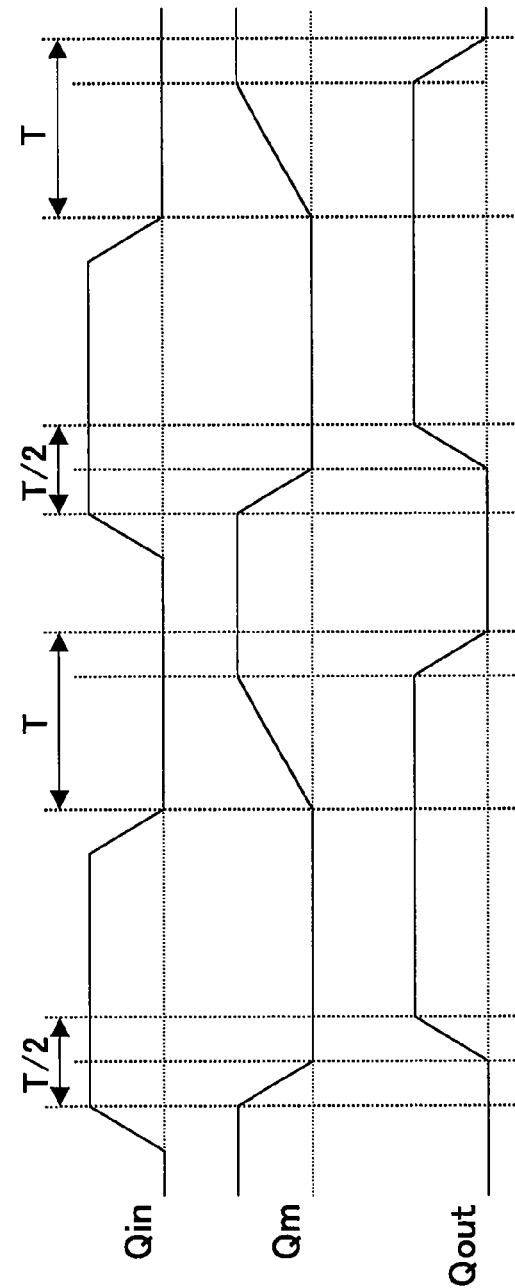
FIG. 6B is a waveform diagram for describing an operation in the delay element of FIG. 6A.

FIG. 6B shows signal waveforms of the output signal Qin, the intermediate output signal Qm, and the delayed output signal Qout in the delay element DD of FIG. 6A. Since the drive ability of the PMOS transistor Dp1 is smaller than the drive ability of the NMOS transistor Dn1, the rising rate of the intermediate output signal Qm is slower than the falling rate of the intermediate output signal Qm. Thereby, the delay amount of a falling edge of the delayed output signal Qout with respect to a falling edge of the output signal Qin is larger than the delay amount of a rising edge of the delayed output signal Qout with respect to a rising edge of the output signal Qin. In other words, the falling delay amount in the delay element DD is larger than the rising delay amount in the delay element DD. For example, the rising delay amount in the delay element DD is "T/2", and the falling delay amount in the delay element DD is "T".

<Operation>

Figure 7:
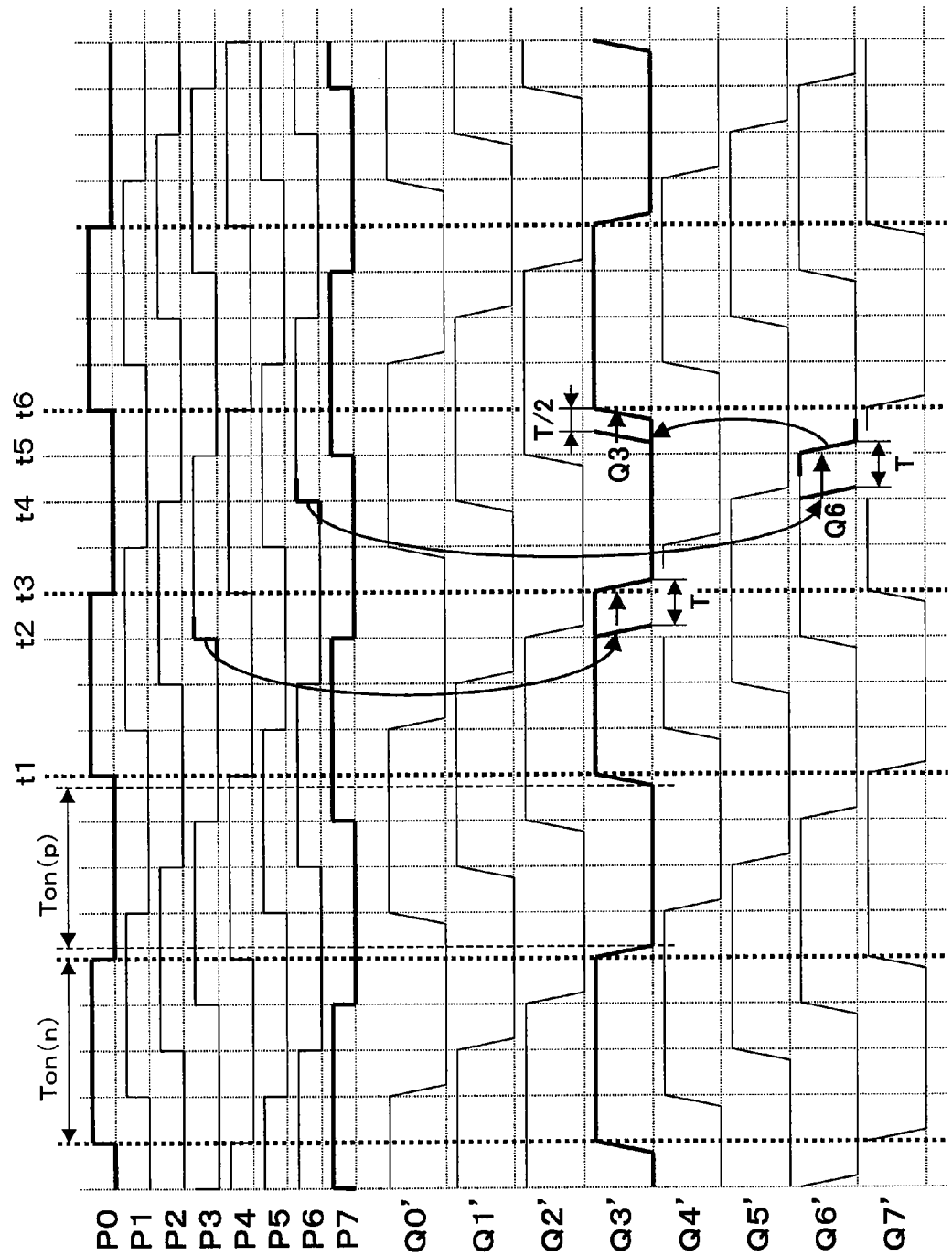
FIG. 7 is a signal waveform diagram for describing an operation of the multiphase level shift system of FIG. 5.

Next, an operation of the multiphase level shift system of FIG. 5 will be described with reference to FIG. 7. It is here assumed that the falling delay amount of the delay element DD is "T=45°", and the rising delay amount of the delay element DD is "T/2=22.5°". Note that, for the sake of simplicity, all delay elements have the same rising delay amount and falling delay amount.

(Starting of Driving of NMOS Transistor)

At time t1, in the level shifter LS0, a clock signal P0 rises, so that the NMOS transistor Mn1 goes into the drive state. Thereby, the voltage value of an output signal Q0 starts decreasing. In this case, a delayed output signal Q3' is at the high level, and therefore, the PMOS transistor Mp1 is in the non-drive state.

(Decrease in Voltage of Delayed Output Signal Q3')

At time t2, in the level shifter LS3, a clock signal P3 rises, so that the NMOS transistor Mn1 goes into the drive state. Thereby, the voltage value of the output signal Q3 starts decreasing. Also, the voltage value of a delayed output signal Q3' starts decreasing, which is delayed by the rising delay amount (T) in the delay element DD.

(Stopping of Driving of NMOS Transistor/Starting of Driving of PMOS Transistor)

At time t3, in the level shifter LS0, the clock signal P0 falls, so that the NMOS transistor Mn1 goes into the non-drive state. On the other hand, the delayed output signal Q3' goes to the low level, so that the PMOS transistor Mp1 goes into the drive state. Thereby, the voltage value of an output signal Q0 starts increasing.

(Decrease in Voltage of Delayed Output Signal Q6')

At time t4, in the level shifter LS6, a clock signal P6 rises, so that the NMOS transistor Mn1 goes into the drive state. Thereby, the voltage value of an output signal Q6 starts decreasing. Also, the voltage value of a delayed output signal Q6' starts decreasing, which is delayed by the falling delay amount (T) in the delay element DD.

(Increase in Voltage of Delayed Output Signal Q3′)

At time t5, in the level shifter LS3, the delayed output signal Q6′ goes to the low level, so that the PMOS transistor Mp1 goes into the drive state. Thereby, the voltage value of the output signal Q3 starts increasing. Also, the voltage value of the delayed output signal Q3′ starts increasing, which is delayed by the rising delay amount (T/2) in the delay element DD.

(Stopping of Driving of PMOS Transistor/Starting of Driving of NMOS Transistor)

At time t6, in the level shifter LS0, the delayed output signal Q3′ goes to the high level, so that the PMOS transistor Mp1 goes into the non-drive state. On the other hand, the clock signal P0 rises, so that the NMOS transistor Mn1 goes into the drive state. Thereby, the voltage value of the output signal Q0 starts decreasing.

Thus, in each of the level shifters LS0 to LS7, the NMOS transistor Mn1 goes into the non-drive state before the PMOS transistor Mp1 goes into the drive state, and the PMOS transistor Mp1 goes into the non-drive state before the NMOS transistor Mn1 goes into the drive state. In other words, a drive period Ton(n) of the NMOS transistor Mn1 and a drive period Ton(p) of the PMOS transistor Mp1 do not overlap each other.

<Non-Overlapping Conditions>

Figure 8A:
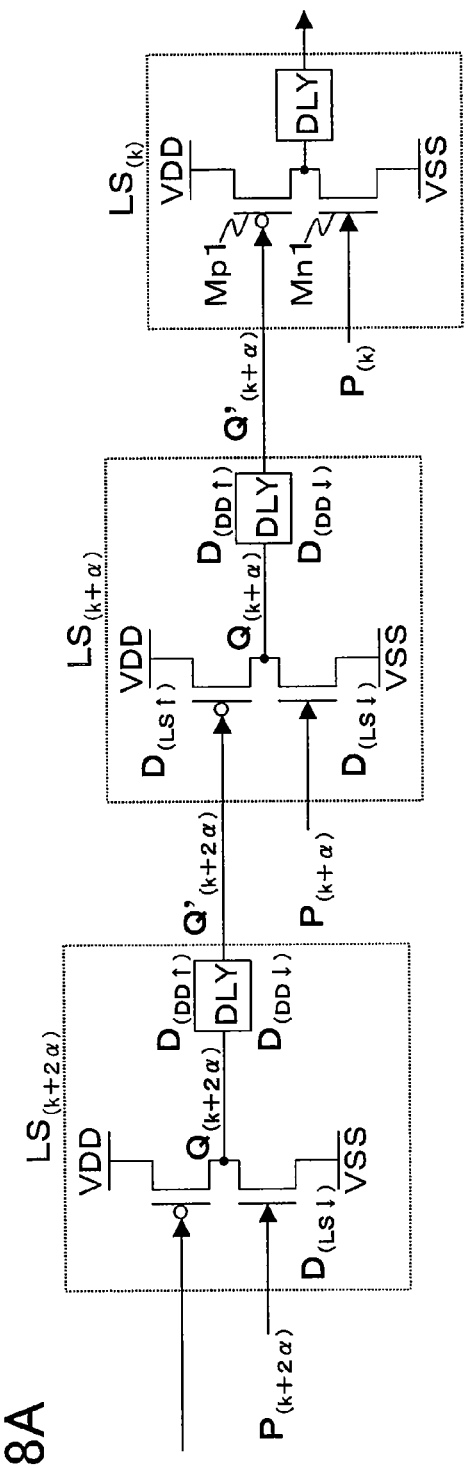
FIG. 8A is a schematic diagram for describing non-overlapping conditions in the multiphase level shift system of the second embodiment.
Figure 8B:
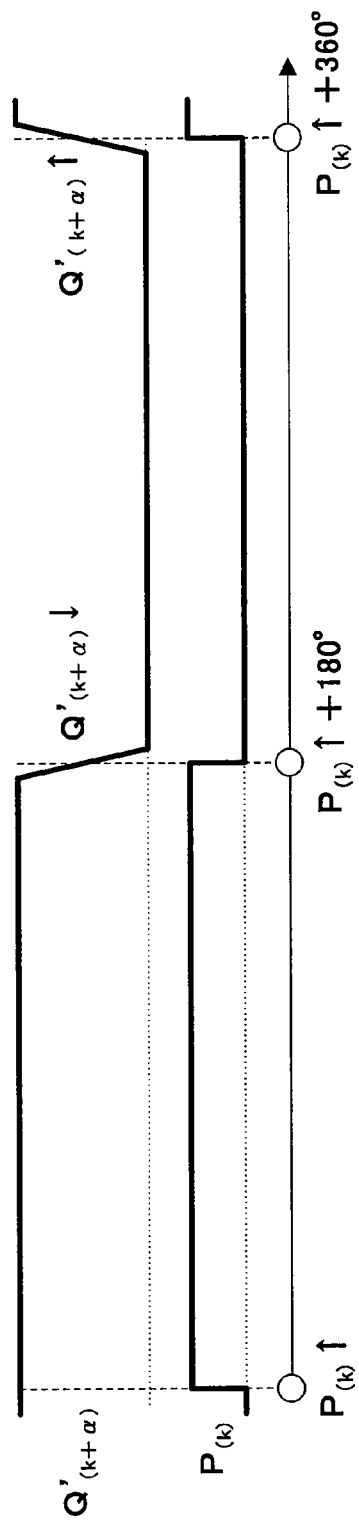
FIG. 8B is a waveform diagram showing a phase relationship between a clock signal and an output signal when the non-overlapping conditions are satisfied.

Next, non-overlapping conditions in this embodiment will be described with reference to FIG. 8. Here, level shifters $LS_{(k)}$, $LS_{(k+\alpha)}$, and $LS_{(k+2\alpha)}$ will be described as an example. Note that it is here assumed that the rising delay amount and the falling delay amount in each delay element are considered in terms of a "phase amount".

Firstly, symbols in the following expressions will be described.

<<Delayed Output Signals>>

$Q'_{(k+\alpha)}$: a delayed output signal of the level shifter $LS_{(k+\alpha)}$ $Q'_{(k+2\alpha)}$: a delayed output signal of the level shifter $LS_{(k+2\alpha)}$ <<Signal Delay Amounts in Delay Element>>

$D_{(DD\uparrow)}$: a rising delay amount in the delay element DD $D_{(DD\downarrow)}$: a falling delay amount in the delay element DD Note that ↑, ↓, $P_{(k)}$, $P_{(k+\alpha)}$, $P_{(k+2\alpha)}$, $Q_{(k+\alpha)}$, $Q_{(k+2\alpha)}$, $D_{(LS\uparrow)}$, $D_{(LS\downarrow)}$, a phase relationship, and a phase amount X are similar to those of FIG. 4.

(Drive Period of Transistor)

In order to satisfy the non-overlapping conditions, the following [Expression 2-1] and [Expression 2-2] need to be satisfied.

$$P_{(k)}\downarrow \leq Q'_{(k+\alpha)}\downarrow \quad \text{[Expression 2-1]}$$

$$Q'_{(k+\alpha)}\uparrow \leq P_{(k)}\uparrow + 360° \quad \text{[Expression 2-2]}$$

Specifically, the falling edge of the delayed output signal Q′(k+α) occurs subsequent in time to (or simultaneously with) the falling edge $P_{(k)}\downarrow$ of the clock signal $P_{(k)}$, and the rising edge of the delayed output signal $Q'_{(k+\alpha)}$ occurs prior in time to (or simultaneously with) the rising edge $P_{(k)}\uparrow$ of the clock signal $P_{(k)}$.

(Timing of Occurrence of Edge of Delayed Output Signal)

In the case of FIG. 4, the falling delay amount and the rising delay amount in each delay element DD are taken into consideration, so that the falling edge $Q'_{(k+\alpha)}\downarrow$ and the rising edge $Q'_{(k+\alpha)}\uparrow$ of the delayed output signal $Q'_{(k+\alpha)}$ are represented by [Expression 2-3] and [Expression 2-4].

$$Q'_{(k+\alpha)}\downarrow = Q_{(k+\alpha)}\downarrow + D_{(DD\downarrow)} \quad \text{[Expression 2-3]}$$
$$= P_{(k+\alpha)}\uparrow + D_{(LS\downarrow)} + D_{(DD\downarrow)}$$

$$Q'_{(k+\alpha)}\uparrow = Q_{(k+\alpha)}\uparrow + D_{(DD\uparrow)} \quad \text{[Expression 2-4]}$$
$$= Q'_{(k+2\alpha)}\downarrow + D_{(LS\uparrow)} + D_{(DD\uparrow)}$$
$$= Q_{(k+2\alpha)}\downarrow + D_{(DD\downarrow)} + D_{(LS\uparrow)} + D_{(DD\uparrow)}$$
$$= P_{(k+2\alpha)}\uparrow + D_{(LS\downarrow)} + D_{(DD\downarrow)} + D_{(LS\uparrow)} + D_{(DD\uparrow)}$$

As is similar to the case of FIG. 4, the falling edge $Q'_{(k+\alpha)}\downarrow$ of the delayed output signal $Q'_{(k+\alpha)}$ depends on the timing of occurrence of the rising edge $P_{(k+\alpha)}\uparrow$ of the clock signal $P_{(k+\alpha)}$, and the rising edge $Q'_{(k+\alpha)}\uparrow$ of the delayed output signal $Q'_{(k+\alpha)}$ depends on the timing of occurrence of the rising edge $P_{(k+2\alpha)}\uparrow$ of the clock signal $P_{(k+2\alpha)}$.

(Phase Amount X)

(1) Initially, a lower limit value of the phase amount X is obtained. Here, [Expression 2-3] is substituted into [Expression 2-1].

Also, since $P_{(k)}\downarrow = P_{(k)}\uparrow + 180°$ and $P_{(k+2\alpha)}\uparrow - P_{(k+\alpha)}\uparrow = X$, $$\text{[Expression 2-1]} \Rightarrow P_{(k)}\uparrow + 180° \leq P_{(k+\alpha)}\uparrow + D_{(LS\downarrow)} + D_{(DD\downarrow)}$$

$$\Rightarrow P_{(k+\alpha)}\uparrow - P_{(k)}\uparrow \geq 180° - D_{(LS\downarrow)} - D_{(DD\downarrow)}$$

$$\Rightarrow X \geq 180° - (D_{(LS\downarrow)} + D_{(DD\downarrow)}) \quad \text{[Expression 2-5]}$$

Thus, [Expression 2-5] is obtained.

(2) Next, an upper limit value of the phase amount X is obtained. Here, [Expression 2-4] is substituted into [Expression 2-2]. Also, it is assumed that $D_{(LS\downarrow)} + D_{(DD\downarrow)} + D_{(LS\uparrow)} + D_{(DD\uparrow)} = A$. Note that, since $P_{(k+2\alpha)}\uparrow - P_{(k)}\uparrow = 2X$, $$\text{[Expression 2-2]} \Rightarrow P_{(k+2\alpha)}\uparrow + A \leq P_{(k)}\uparrow + 360°$$

$$\Rightarrow P_{(k+2\alpha)}\uparrow - P_{(k)}\uparrow \leq 360° - A$$

$$\Rightarrow 2X \leq 360° - D_{(LS\downarrow)} - D_{(LS\uparrow)} - D_{(DD\downarrow)} - D_{(DD\uparrow)}$$

$$\Rightarrow X \leq 180° - (½) \cdot (D_{(LS\downarrow)} + D_{(LS\uparrow)} + D_{(DD\downarrow)} + D_{(DD\uparrow)}) \quad \text{[Expression 2-6]}$$

Thus, [Expression 2-6] is obtained.

(3) Next, the range of the phase amount X is obtained. Here, since $D_{(LS\downarrow)}, D_{(DD\downarrow)}, D_{(LS\uparrow)}, D_{(DD\uparrow)} > 0°$ and $X > 0°$,

[Expression 2-5] $\Rightarrow 0° < X$

[Expression 2-6] $\Rightarrow X < 180°$

Therefore, $$0° < X < 180° \quad \text{[Expression 2-7]}$$

Thus, [Expression 2-7] is obtained.

(4) As described above, if the phase amount X satisfies [Expression 2-5] and [Expression 2-6], the non-overlapping conditions can be satisfied. Also, the possible range of the phase amount X is represented by [Expression 2-7]. Specifically, although the possible range of the phase amount X varies depending on the falling delay amount and the rising delay amount in each level shifter, the phase amount X which can satisfy the non-overlapping conditions falls within the range of [Expression 2-7].

(Phase Delay Amounts $D_{(DD\downarrow)}$ and $D_{(DD\uparrow)}$ in Delay Element)

Next, the falling delay amount $D_{(LS\downarrow)}$ and the rising delay amount $D_{(DD\uparrow)}$ in the delay element DD are obtained.

[Expression 2-5] $\Rightarrow D_{(DD\downarrow)} \geq 180° - D_{(LS\downarrow)} - X$ [Expression 2-8]

[Expression 2-6] $\Rightarrow D_{(DD\downarrow)} + D_{(DD\uparrow)} \leq 360° - (D_{(LS\downarrow)} + D_{(LS\uparrow)}) - 2X$ [Expression 2-9]

By [Expression 2-8]–[Expression 2-9], $$D_{(DD\uparrow)} \leq 180° - D_{(LS\uparrow)} - X \quad \text{[Expression 2-10]}$$

As described above, if the signal delay amount of the delay element DD is set so as to satisfy [Expression 2-8] and [Expression 2-10], the non-overlapping conditions can be satisfied without changing the signal delay amount in the level shifter.

<Effect>

As described above, in each level shifter, the overlapping of the current extraction period and the current supply period can be eliminated, so that the occurrence of a through current can be suppressed. Thereby, power consumption in each level shifter can be reduced.

Also, since the current extraction period and the current supply period do not substantially overlap, a delay amount in each level shifter can be reduced. Thereby, the phase precision of the output signal with respect to the clock signal can be improved.

Further, by adjusting a signal delay amount in the delay element, the occurrence of a through current can be suppressed. Therefore, the multiphase level shift system can be easily constructed without changing the design of the level shifter.

Note that the falling delay amount is preferably larger than the rising delay amount in the delay element. In this case, the possible range of the phase amount X is broadened, so that the multiphase level shift system can be easily constructed.

Third Embodiment

<Configuration>

Figure 9:
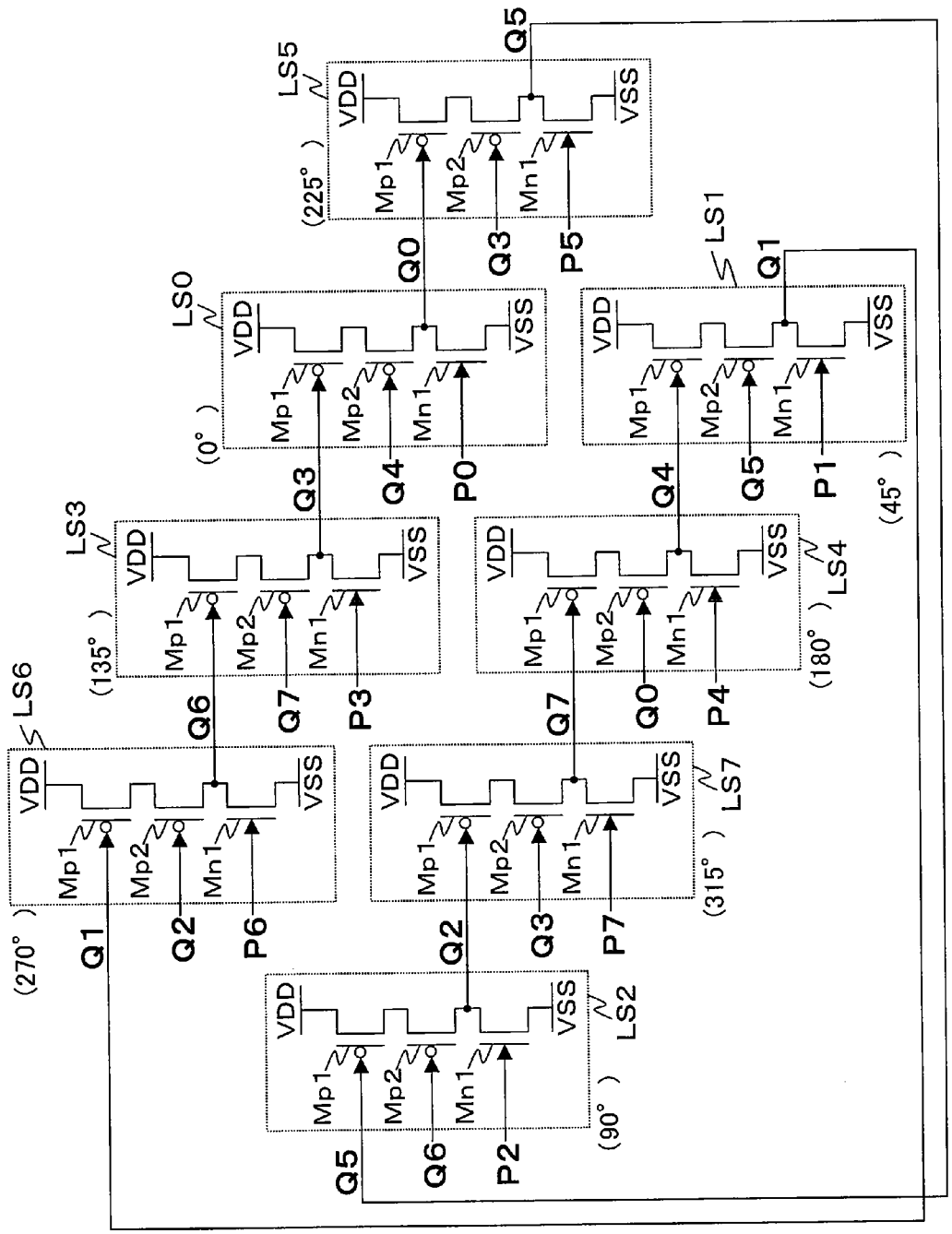
FIG. 9 is a circuit diagram showing an exemplary configuration of a multiphase level shift system according to a third embodiment of the present invention.

FIG. 9 shows a configuration of a multiphase level shift system according to a third embodiment of the present invention. In this system, level shifters LS0 to LS7 each further include a PMOS transistor Mp2 in addition to the NMOS transistor Mn1 and the PMOS transistor Mp1 of FIG. 1. The PMOS transistor Mp2 and the PMOS transistor Mp1 are connected in series between a power supply node and an output node.

In each of the level shifters LS0 to LS7, the gate of the PMOS transistor Mp2 receives an output signal from a level shifter corresponding to a clock signal delayed by a phase amount Y ($X<Y<360°-X$) from the clock signal given to the NMOS transistor Mn1. Also, the level shifters all have the same phase amount Y. In FIG. 9, $X=135°$ and $Y=180°$.

<Phase Amount Y in Each Level Shifter>

Figure 10:
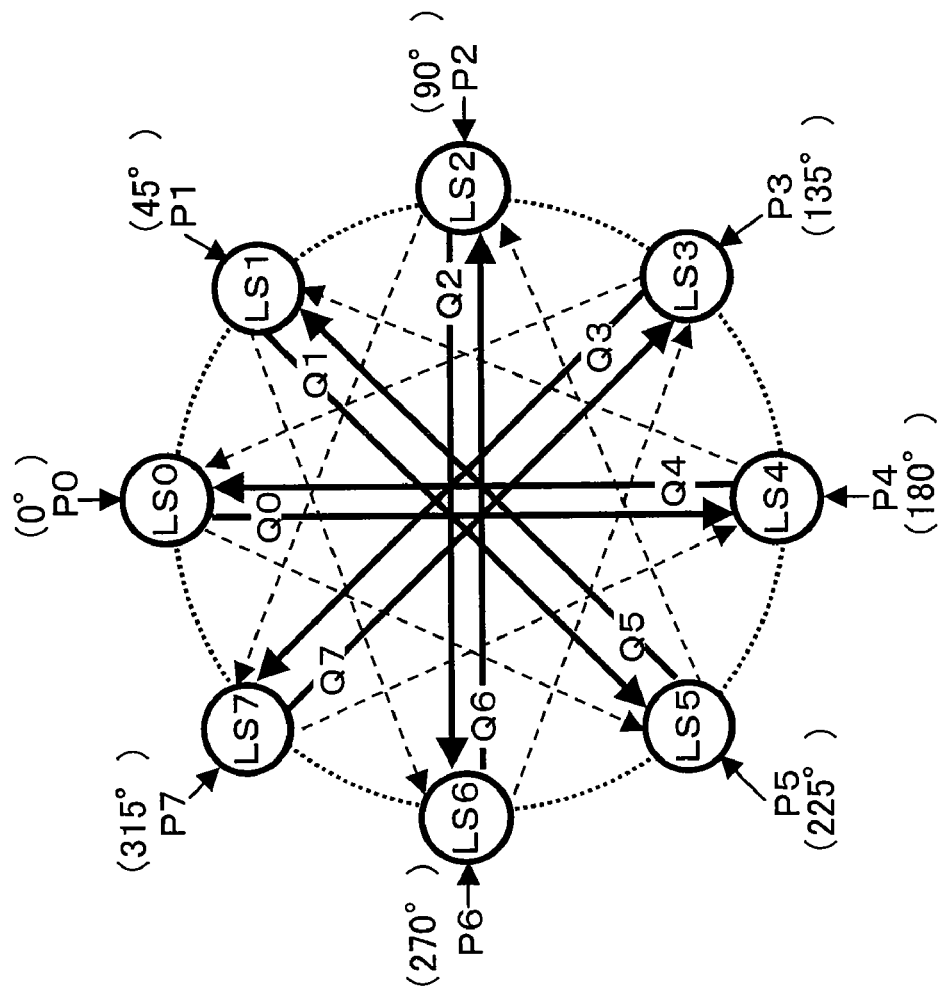
FIG. 10 is a conceptual diagram showing a phase relationship between a clock signal given to each level shifter of FIG. 9, and an output signal.

FIG. 10 shows a phase relationship between a clock signal given to the NMOS transistor Mn1 and an output signal given to the PMOS transistor Mp2 in each of the level shifters LS0 to LS7 of FIG. 9. Note that the phase relationship between the clock signal given to the NMOS transistor Mn1 and the output signal given to the PMOS transistor Mp1 in each of the level shifters LS0 to LS7 of FIG. 9 is similar to that of FIG. 2, and therefore, the output signal given to the PMOS transistor Mp1 is simplified by a dashed line in FIG. 10.

In a level shifter $LS_{(k)}$ corresponding to a clock signal $P_{(k)}$ having a $k^{th}$ phase, the NMOS transistor Mn1 receives the clock signal $P_{(k)}$, and the PMOS transistor Mp2 receives an output signal $Q_{(k+\beta)}$ from a level shifter $LS_{(k+\beta)}$ corresponding to a clock signal $P_{(k+\beta)}$. The clock signal $P_{(k+\beta)}$ is delayed by the phase amount Y from the clock signal $P_{(k)}$. Here, "$\beta$" is an integer, and $\beta=Y/T$ (T is a phase interval of clock signals). Note that, when $(k+\beta)>(n-1)$, $(k+\beta)$ is a remainder which is left when $(k+\beta)$ is divided by n. In FIG. 10, $n=8$ and $\beta=180°/45°=4$.

<Operation>

Figure 11:
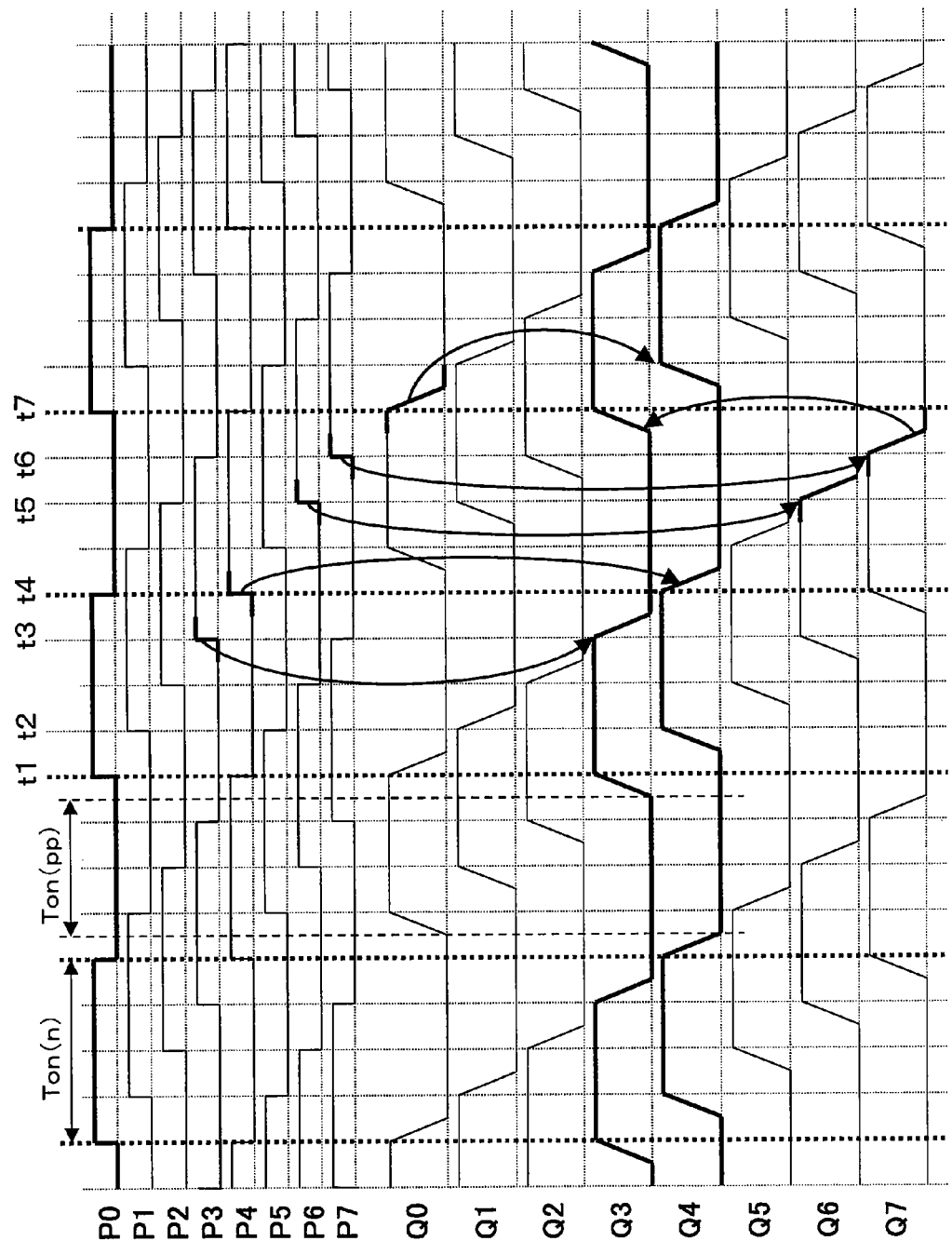
FIG. 11 is a signal waveform diagram for describing an operation of the multiphase level shift system of FIG. 9.

Next, an operation of the multiphase level shift system of FIG. 9 will be described with reference to FIG. 11. Note that, in FIG. 11, both the falling delay amount and the rising delay amount of a level shifter are assumed to be "22.5°".

(Starting of Driving of NMOS Transistor)

At time t1, in the level shifter LS0, the clock signal P0 rises, so that the NMOS transistor Mn1 goes into the drive state. Thereby, the voltage value of the output signal Q0 starts decreasing. Also, in this case, since the output signal Q4 is at the low level, the PMOS transistor Mp2 is in the drive state, however, since the output signal Q3 is not at the low level, the PMOS transistor Mp1 is in the non-drive state.

(Stopping of Driving of Both PMOS Transistors)

At time t2, in the level shifter LS0, the output signal Q4 goes to a level higher than the low level, so that the PMOS transistor Mp2 goes into the non-drive state. Thereby, both the PMOS transistors Mp1 and Mp2 go into the non-drive state.

(Decrease in Voltage of Output Signal Q3)

At time t3, in the level shifter LS3, the clock signal P3 rises, so that the NMOS transistor Mn1 goes into the drive state. Thereby, the voltage value of the output signal Q3 in the level shifter LS3 starts decreasing.

(Decrease in Voltage of Output Signal Q4/Stopping of Driving of NMOS Transistor)

At time t4, in the level shifter LS4, the clock signal P4 rises, so that the NMOS transistor Mn1 goes into the drive state. Thereby, the voltage value of the output signal Q4 starts decreasing. On the other hand, at time t4, in the level shifter LS0, the output signal Q3 is at the low level, and therefore, the PMOS transistor Mp1 is in the drive state, however, since the output signal Q4 is in a starting state of transition to the low level, the PMOS transistor Mp2 is still in the non-drive state. Also, at time t4, the clock signal P0 falls, so that the NMOS transistor Mn1 is changed into the non-drive state.

(Starting of Driving Both PMOS Transistors)

At times t4 to t5, if the output signal Q4 goes to the low level, the PMOS transistor Mp2 goes into the drive state in the level shifter LS0. Therefore, both the PMOS transistors Mp1 and Mp2 go into the drive state, so that the voltage value of the output signal Q0 starts increasing.

(Decrease in Voltage of Output Signal Q6)

At time t5, in the level shifter LS6, the clock signal P6 rises, so that the NMOS transistor Mn1 goes into the drive state. Thereby, the voltage value of the output signal Q6 starts decreasing.

(Decrease in Voltage of Output Signal Q7)

At time t6, in the level shifter LS7, the clock signal P7 rises, so that the NMOS transistor Mn1 goes into the drive state. Thereby, the voltage value of the output signal Q7 starts decreasing. On the other hand, at time t6, in the level shifter LS3, the output signal Q6 is at the low level, and therefore, the PMOS transistor Mp1 is in the drive state, however, since the output signal Q7 is in a starting state of transition to the low level, the PMOS transistor Mp2 is still in the non-drive state.

(Increase in Voltage of Output Signal Q3)

At times t6 to t7, if the output signal Q7 goes to the low level, the PMOS transistor Mp2 goes into the drive state in the level shifter LS3. Thereby, both the PMOS transistors Mp1 and Mp2 go into the drive state, so that the voltage value of the output signal Q3 starts increasing.

(Stopping of Driving of PMOS Transistor/Starting of Driving of NMOS Transistor)

At time t7, in the level shifter LS0, since the output signal Q4 is at the low level, the PMOS transistor Mp2 is in the drive state, however, since the output signal Q3 is at the high level, the PMOS transistor Mp1 goes into the non-drive state. Also, the clock signal P0 rises, so that the NMOS transistor Mn1 goes into the drive state. Thereby, the voltage value of the output signal Q0 starts decreasing.

Thus, in the level shifter LS0 as an example, during a period in which the clock signal P0 is at the high level, there is no period in which both the output signals Q3 and Q4 input to the level shifter LS0 are at the low level. Also, in each of the level shifters LS1 to LS7, a phase relationship between the clock signal and the two output signals is similar to the phase relationship in the level shifter LS0. Specifically, in each of the level shifters LS0 to LS7, the NMOS transistor goes into the non-drive state before both the PMOS transistors Mp1 and Mp2 go into the drive state, and at least one of the PMOS transistors Mp1 and Mp2 goes into the non-drive state before the NMOS transistor Mn1 goes into the drive state. In other words, a drive period Ton(n) (current extraction period) of the NMOS transistor Mn1 and a Ton(pp) (current supply period) in which both the PMOS transistors Mp1 and Mp2 are driven do not overlap each other.

Note that, at time t1 or the like, the timing of transition of the drive state of the NMOS transistor and the timing of transition of the drive state of the PMOS transistor may be the same.

<Non-Overlapping Conditions>

Next, non-overlapping conditions in this embodiment will be described with reference to FIG. 12. Here, level shifters $LS_{(k)}$, $LS_{(k+\alpha)}$, $LS_{(k+\beta)}$, and $LS_{(k+\alpha+\beta)}$ will be described as an example. Firstly, symbols used in the following expressions will be described. Note that $\uparrow$, $\downarrow$, $P_{(k)}$, $P_{(k+\alpha)}$, $Q_{(k+\alpha)}$, $Q_{(k+2\alpha)}$, $D_{(LS\uparrow)}$, and $D_{(LS\downarrow)}$ are similar to those of FIG. 4.

<<Clock Signals>>

$P_{(k+\beta)}$: a clock signal having a $(k+\beta)^{th}$ phase
$P_{(k+\alpha+\beta)}$: clock signal having a $(k+\alpha+\beta)^{th}$ phase <<Output Signals>>

$Q_{(k+\beta)}$: an output signal of the level shifter $LS_{(k+\beta)}$
$Q_{(k+\alpha+\beta)}$: an output signal of the level shifter $LS_{(k+\alpha+\beta)}$ <<Phase Relationships>>

$P_{(k)}\uparrow < P_{(k+\alpha)}\uparrow$ $P_{(k+\alpha)}\uparrow < P_{(k+\beta)}\uparrow < P_{(k+\alpha+\beta)}\uparrow$ $P_{(k+\alpha+\beta)}\uparrow < (P_{(k)}\uparrow + 360°)$ $P_{(k)}\downarrow = P_{(k)}\uparrow + 180°$ $Q_{(k+\alpha)}\downarrow < Q_{(k+\beta)}\downarrow$ $Q_{(k+\alpha)}\uparrow < Q_{(k+\beta)}\uparrow$ <<Phase Amount X, Phase Amount Y>>

$P_{(k+\alpha)}\uparrow - P_{(k)}\uparrow = P_{(k+\alpha+\beta)}\uparrow - P_{(k+\beta)}\uparrow = X$ $P_{(k+\alpha)}\uparrow - P_{(k)}\uparrow > 0° \Rightarrow X > 0°$ $P_{(k+\beta)}\uparrow - P_{(k)}\uparrow = Y$ $P_{(k+\beta)}\uparrow - P_{(k)}\uparrow > 0° \Rightarrow Y > 0°$ $P_{(k+\beta)}\uparrow - P_{(k)}\uparrow > P_{(k+\alpha)}\uparrow - P_{(k)}\uparrow \Rightarrow Y > X$ A phase amount X which is a phase delay amount of the clock signal $P_{(k+\alpha)}$ with respect to the clock signal $P_{(k)}$ is defined by the above-described expression. Also, a phase delay amount of the clock signal $P_{(k+\alpha+\beta)}$ with respect to the clock signal $P_{(k+\beta)}$ is equal to a phase delay amount of the clock signal $P_{(k+\alpha)}$ with respect to the clock signal $P_{(k)}$. Also, a phase amount Y which is a phase delay amount of the clock signal $P_{(k+\beta)}$ with respect to the clock signal $P_{(k)}$ is defined by the above-described expression. Further, a relationship in magnitude between the phase amount X and the phase amount Y is represented by the above-described expression.

(Drive Period of Transistor)

In the level shifter $LS_{(k)}$, during a period from the rising edge $P_{(k)}\uparrow$ to the falling edge $P_{(k)}\downarrow$ of the clock signal $P_{(k)}$, the NMOS transistor Mn1 is in the drive state, so that a current is extracted from the output node to the ground node.

Also, during a period from the falling edge $Q_{(k+\alpha)}\downarrow$ to the rising edge $Q_{(k+\alpha)}\uparrow$ of the output signal $Q_{(k+\alpha)}$, the PMOS transistor Mp1 is in the drive state. On the other hand, during a period from the falling edge $Q_{(k+\beta)}\downarrow$ to the rising edge $Q_{(k+\beta)}\uparrow$ of the output signal $Q_{(k+\beta)}$, the PMOS transistor Mp2 is in the drive state. Since $Q_{(k+\alpha)}\uparrow < Q_{(k+\beta)}\uparrow$, during a period from the falling edge $Q_{(k+\beta)}\downarrow$ of the output signal $Q_{(k+\beta)}$ to the rising edge $Q_{(k+\alpha)}\uparrow$ of the output signal $Q_{(k+\alpha)}$, both the output signals $Q_{(k+\alpha)}$ and $Q_{(k+\beta)}$ are at the low level, so that both the PMOS transistors Mp1 and Mp2 are in the drive state, and therefore, a current is supplied from the power supply node to the output node.

Therefore, in order to satisfy the non-overlapping conditions, the following [Expression 3-1] and [Expression 3-2] need to be satisfied.

$$P_{(k)}\downarrow \leq Q_{(k+\beta)}\downarrow \qquad \text{[Expression 3-1]}$$

$$Q_{(k+\alpha)}\uparrow \leq P_{(k)}\uparrow + 360° \qquad \text{[Expression 3-2]}$$

Specifically, the falling edge $Q_{(k+\beta)}\downarrow$ of the output signal $Q_{(k+\beta)}$ occurs subsequent in time to (or simultaneously with) the falling edge $P_{(k)}\downarrow$ of the clock signal $P_{(k)}$, and the rising edge $Q_{(k+\alpha)}\uparrow$ of the output signal $Q_{(k+\alpha)}$ occurs prior in time to (or simultaneously with) the rising edge $P_{(k)}\uparrow$ of the clock signal $P_{(k)}$.

(Timing of Occurrence of Edge of Output Signal)

In the level shifter $LS_{(k+\beta)}$, if the rising edge $P_{(k+\beta)}\uparrow$ of the clock signal $P_{(k+\beta)}$ occurs, the voltage value of the output signal $Q_{(k+\beta)}$ starts decreasing. On the other hand, in the level shifter $LS_{(k+\alpha)}$, if the falling edge $Q_{(k+\alpha+\beta)}\downarrow$ of the output signal $Q_{(k+\alpha+\beta)}$ occurs after the occurrence of the falling edge $Q_{(k+2\alpha)}\downarrow$ of the output signal $Q_{(k+2\alpha)}$, the voltage value of the output signal $Q_{(k+\alpha)}$ starts increasing. Further, in the level shifter $LS_{(k+\alpha+\beta)}$, if the rising edge $P_{(k+\alpha+\beta)}\uparrow$ of the clock signal $P_{(k+\alpha+\beta)}$ occurs, the voltage value of the output signal $Q_{(k+\alpha+\beta)}$ starts decreasing.

Here, taking into consideration a rising delay amount and a falling delay amount in each level shifter, the falling edge $Q_{(k+\beta)}\downarrow$ of the output signal $Q_{(k+\beta)}$ and the rising edge $Q_{(k+\alpha)}\uparrow$ of the output signal $Q_{(k+\alpha)}$ are represented by [Expression 3-3] and [Expression 3-4].

$$Q_{(k+\beta)}\downarrow = P_{(k+\beta)}\uparrow + D_{(LS\downarrow)} \qquad \text{[Expression 3-3]}$$

$$Q_{(k+\alpha)}\uparrow = Q_{(k+\alpha+\beta)}\downarrow + D_{(LS\uparrow)} \qquad \text{[Expression 3-4]}$$
$$= P_{(k+\alpha+\beta)}\uparrow + D_{(LS\downarrow)} + D_{(LS\uparrow)}$$

Specifically, the falling edge $Q_{(k+\beta)}\downarrow$ of the output signal $Q_{(k+\beta)}$ depends on the timing of occurrence of the rising edge $P_{(k+\beta)}\uparrow$ of the clock signal $P(k+\beta)$, and the rising edge $Q_{(k+\alpha)}\uparrow$ of the output signal $Q_{(k+\alpha)}$ depends on the rising edge $P_{(k+\alpha+\alpha)}\uparrow$ of the clock signal $P_{(k+\alpha+\beta)}$.

(Phase Amount X, Phase Amount Y)

(1) Initially, [Expression 3-3] is substituted into [Expression 3-1].

Also, since $P_{(k)}\downarrow = P_{(k)}\uparrow + 180°$ and $P_{(k+\beta)}\uparrow - P_{(k)}\uparrow = Y$,

[Expression 3-1] $\Rightarrow P_{(k)}\uparrow + 180° \leq P_{(k+\beta)}\uparrow + D_{(LS\downarrow)}$ $\Rightarrow P_{(k+\beta)}\uparrow - P_{(k)}\uparrow \geq 180° - D_{(LS\downarrow)}$ $\Rightarrow Y \geq 180° - D_{(LS\downarrow)} \qquad \text{[Expression 3-5]}$ Thus, [Expression 3-5] is obtained.

(2) Next, [Expression 3-4] is substituted into [Expression 3-2].

Also, since $P_{(k+\alpha)}\uparrow - P_{(k)}\uparrow = P_{(k+\alpha+\beta)}\uparrow - P_{(k+\beta)}\uparrow = X$, and $$P_{(k+\beta)}\uparrow - P_{(k)}\uparrow = Y,$$

[Expression 3-7]

$$\Rightarrow P_{(k+\alpha+\beta)}\uparrow + D_{(LS\downarrow)} + D_{(LS\uparrow)} \leq P_{(k)}\uparrow + 360°$$

$$\Rightarrow P_{(k+\alpha+\beta)}\uparrow - P_{(k)}\uparrow \leq 360° - D_{(LS\downarrow)} - D_{(LS\uparrow)}$$

$$\Rightarrow X+Y \leq 360° - D_{(LS\downarrow)} - D_{(LS\uparrow)} \qquad \text{[Expression 3-6]}$$

Thus, [Expression 3-6] is obtained.

(3) Next, the phase amount X is obtained. Here, [Expression 3-5]-[Expression 3-6] is calculated. Also, since X>0°,

[Expression 3-5]-[Expression 3-6] $\Rightarrow X \leq 180° - D_{(LS\uparrow)}$ $$\Rightarrow 0° < X \leq 180° - D_{(LS\uparrow)} \qquad \text{[Expression 3-7]}$$

Also, since $D_{(LS\uparrow)} > 0°$,

[Expression 3-7] $\Rightarrow 0° < X < 180°$ [Expression 3-8]

Thus, [Expression 3-7] and [Expression 3-8] are obtained.

(4) Next, the phase amount Y is obtained. Here, according to [Expression 3-5] and [Expression 3-6], $$180° - D_{(LS\downarrow)} \leq Y \leq 360° - D_{(LS\downarrow)} - D_{(LS\uparrow)} - X \qquad \text{[Expression 3-9]}$$

Also, $D_{(LS\downarrow)} > 0°$, $D_{(LS\uparrow)} > 0°$, and Y>X,

[Expression 3-9] $\Rightarrow X < Y < 360° - X$ [Expression 3-10]

Thus, [Expression 3-9] and [Expression 3-10] are obtained.

(5) As described above, if the phase amount X satisfies [Expression 3-7] and the phase amount Y satisfies [Expression 3-9], the non-overlapping conditions can be satisfied. Also, the possible range of the phase amount X is represented by [Expression 3-8], and the possible range of the phase amount Y is represented by [Expression 3-10]. Specifically, although the possible range of the phase amount X and the possible range of the phase amount Y vary depending on the falling delay amount and the rising delay amount in a level shifter, the phase amount X and the phase amount Y which can satisfy the non-overlapping conditions fall within the ranges represented by [Expression 3-8] and [Expression 3-10], respectively.

<Effect>

As described above, in each level shifter, the overlapping of the current extraction period and the current supply period can be eliminated, so that the occurrence of a through current can be suppressed. Thereby, power consumption in each level shifter can be reduced.

Also, since the current supply period and the current extraction period do not substantially overlap, the delay amount in each level shifter can be reduced. Thereby, the phase precision of the output signal with respect to the clock signal can be improved.

Figures 12A, 12B:
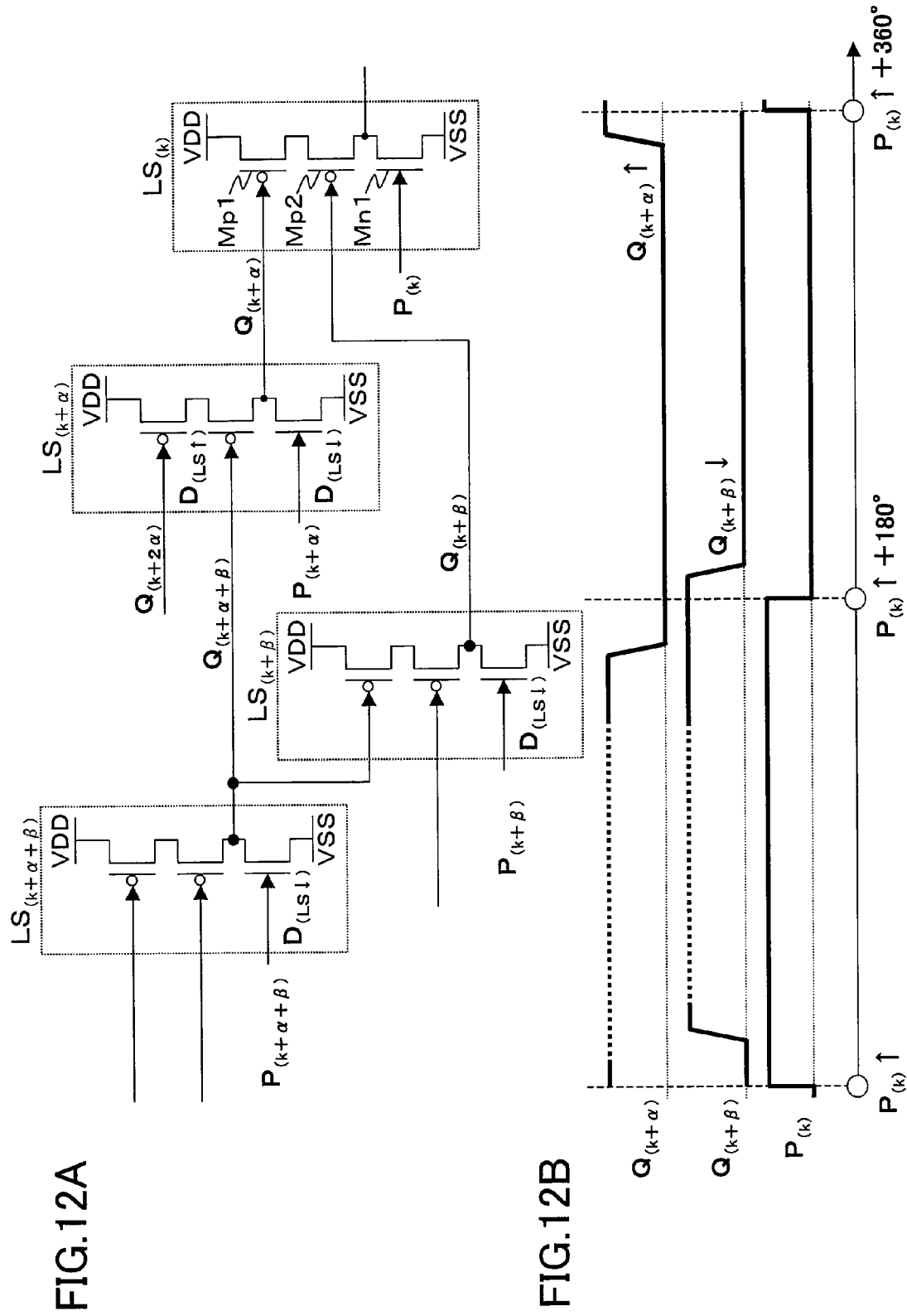
FIG. 12A is a schematic diagram for describing non-overlapping conditions in the multiphase level shift system of the third embodiment.
FIG. 12B is a waveform diagram showing a phase relationship between a clock signal and an output signal when the non-overlapping conditions are satisfied.

Further, according to FIG. 12 and [Expression 3-4], the rising edge $Q_{(k+\alpha)}\uparrow$ of the output signal $Q_{(k+\alpha)}$ depends on the timing of occurrence of the rising edge of the clock signal $P_{(k+\alpha+\beta)}\uparrow$ whose phase delay amount is the phase amount Y. In other words, by adjusting the phase amount Y, the timing of occurrence of the rising edge of the output signal can be adjusted. Thereby, the duty ratio of the output signal can also be adjusted.

Note that, in each level shifter, the output signals given to the PMOS transistors Mp1 and Mp2 may be switched with the other transistor. For example, in the level shifter LS0, the output signal Q4 may be given to the gate of the PMOS transistor Mp1, and the output signal Q3 may be given to the gate of the PMOS transistor Mp2.

Fourth Embodiment

<Multiphase Level Shift System>

Figure 13:
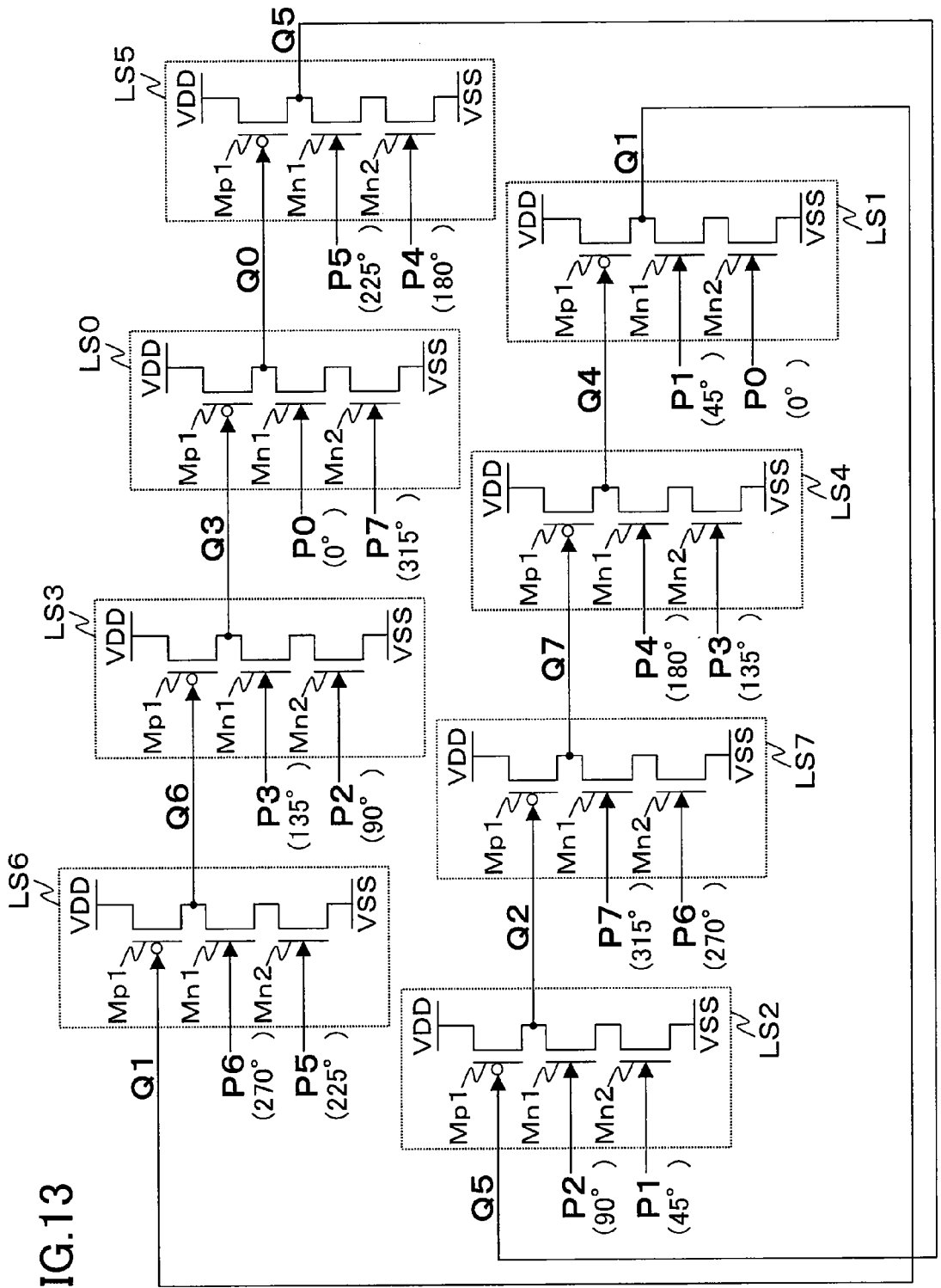
FIG. 13 is a circuit diagram showing an exemplary configuration of a multiphase level shift system according to a fourth embodiment of the present invention.

FIG. 13 shows a configuration of a multiphase level shift system according to a fourth embodiment of the present invention. In this system, level shifters LS0 to LS7 each include an NMOS transistor Mn2 in addition to the NMOS transistor Mn1 and the PMOS transistor Mp1 of FIG. 1. The NMOS transistor Mn2 and the NMOS transistor Mn1 are connected in series between a ground node and an output node.

In each of the level shifters LS0 to LS7, the gate of the NMOS transistor Mn2 receives a clock signal advanced by a phase amount Z (0°<Z<180°) from the clock signal given to the gate of the NMOS transistor Mn1. Also, the level shifters all have the same phase amount Z. In FIG. 13, X=135° and Z=45°.

<Phase Amount Y in Each Level Shifter>

Figure 14:
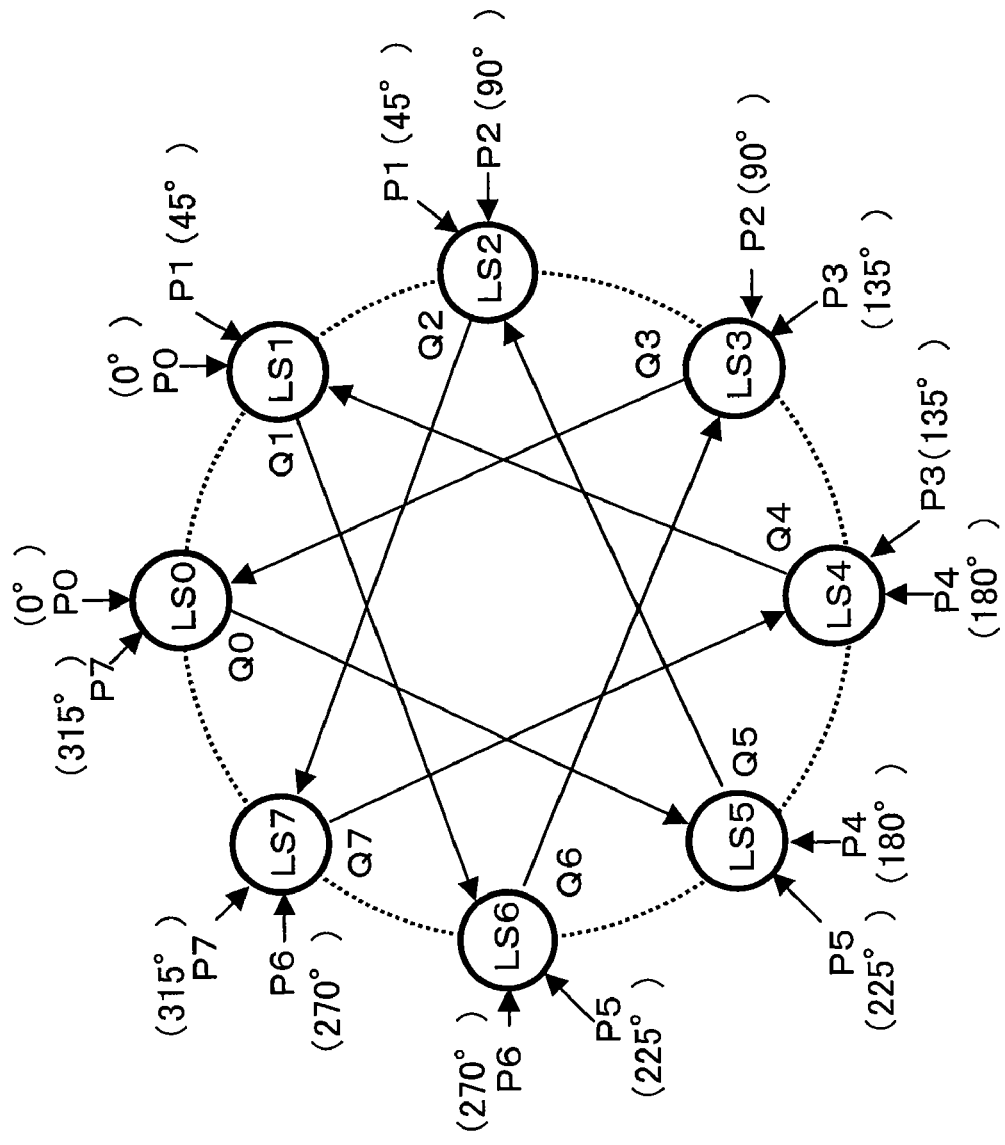
FIG. 14 is a conceptual diagram showing a phase relationship between a clock signal given to each level shifter of FIG. 13, and an output signal.

FIG. 14 shows a phase relationship between a clock signal given to the NMOS transistor Mn1, a clock signal given to the NMOS transistor Mn2, and an output signal given to the PMOS transistor Mp1 in each of the level shifters LS0 to LS7 of FIG. 13.

In a level shifter $LS_{(k)}$ corresponding to a clock signal $P_{(k)}$ having a $k^{th}$ phase, the NMOS transistor Mn1 receives the clock signal $P_{(k)}$, the NMOS transistor Mn2 receives a clock signal $P_{(k-\gamma)}$, and the PMOS transistor Mp1 receives an output signal $Q_{(k+\alpha)}$ from a level shifter $LS_{(k+\alpha)}$ corresponding to a clock signal $P_{(k+\alpha)}$. The clock signal $P_{(k-\gamma)}$ is advanced by the phase amount Z from the clock signal $P_{(k)}$. Here, "γ" is an integer and γ=Z/T (T is a phase interval of clock signals). Note that, when (k−γ)<0, (k−γ) is a remainder which is left when dividing (k+γ+n) by n. In FIG. 14, n=8, α=135°/45°=3, and γ=45°/45°=1.

<Operation>

Figure 15:
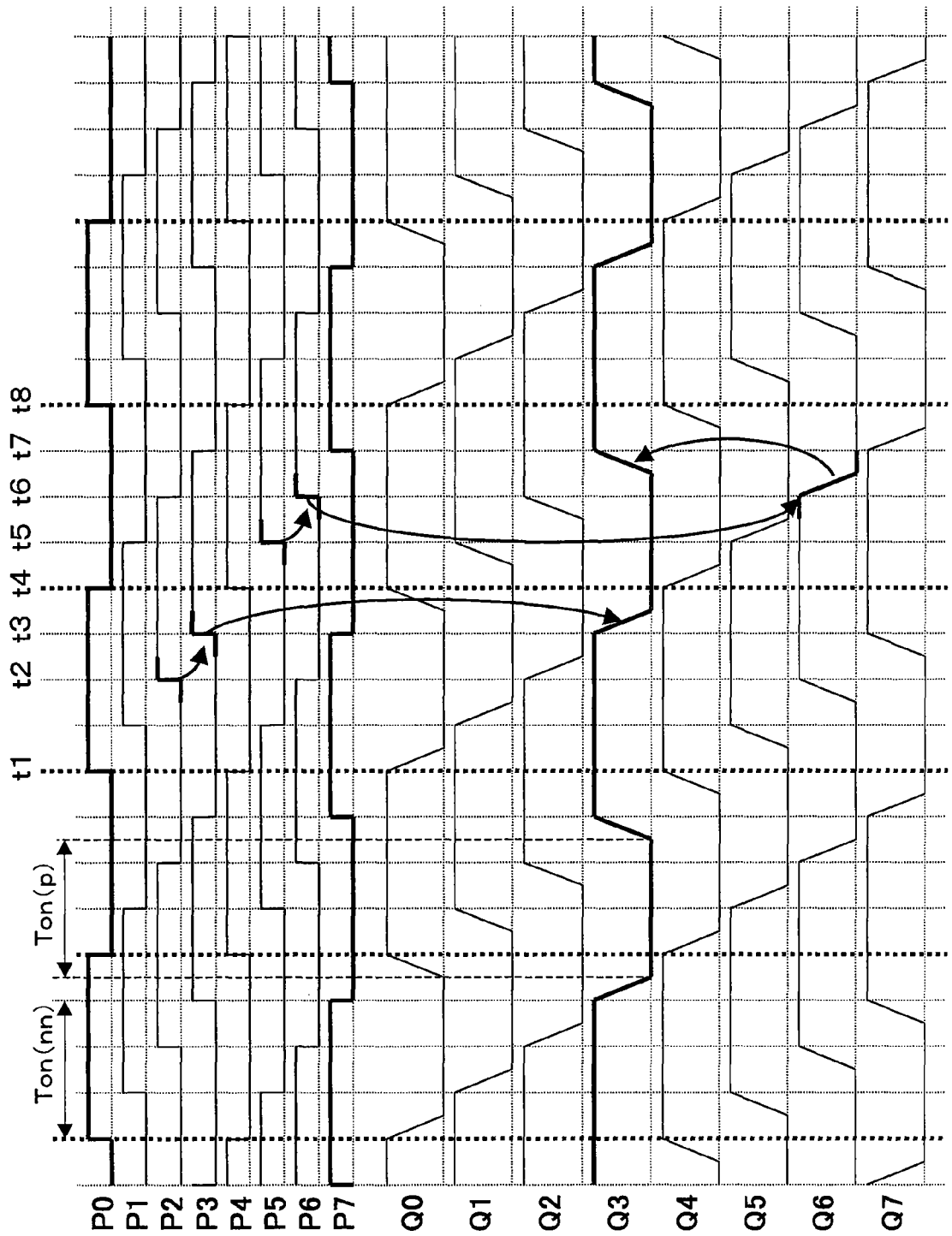
FIG. 15 is a signal waveform diagram for describing an operation of the multiphase level shift system of FIG. 13.

Next, an operation of the multiphase level shift system of FIG. 13 will be described with reference to FIG. 15. Note that, in FIG. 15, both a falling delay amount and a rising delay amount in a level shifter are assumed to be "22.5°".

(Starting of Driving of Both NMOS Transistors)

At time t1, in the level shifter LS0, the clock signal P0 rises, so that the NMOS transistor Mn1 goes into the drive state. In this case, since the clock signal P7 is at the high level, the NMOS transistor Mn2 is also in the drive state. Thereby, the voltage value of the output signal Q0 starts decreasing.

(Decrease in Voltage of Output Signal Q3/Stopping of Driving of NMOS Transistor)

At time t2, in the level shifter LS3, the clock signal P2 rises, so that the NMOS transistor Mn2 goes into the drive state. Next, at time t3, in the level shifter LS3, the clock signal P3 rises, so that the NMOS transistor Mn1 goes into the drive state. Therefore, both the NMOS transistors Mn1 and Mn2 go into the drive state, so that the voltage value of the output signal Q3 starts decreasing. On the other hand, in the level shifter LS0, the clock signal P7 falls, so that the NMOS transistor Mn2 goes into the non-drive state.

(Starting of Driving of PMOS Transistor)

At times t3 to t4, if the output signal Q3 goes to the low level, the PMOS transistor Mp1 goes into the drive state in the level shifter LS0. Thereby, the voltage value of the output signal Q0 starts increasing.

(Stopping of Driving of Both NMOS Transistors)

At time t4, in the level shifter LS0, the clock signal P0 falls, so that the NMOS transistor Mn1 goes into the non-drive state. Thereby, both the NMOS transistors Mn1 and Mn2 go into the non-drive state.

(Decrease in Voltage of Output Signal Q6)

At time t5, in the level shifter LS6, the clock signal P5 rises, so that the NMOS transistor Mn2 goes into the drive state. At time t6, in the level shifter LS6, the clock signal P6 rises, so that the NMOS transistor Mn1 goes into the drive state. Thereby, both the NMOS transistors Mn1 and Mn2 go into the drive state, so that the voltage value of the output signal Q6 starts decreasing.

(Increase in Voltage of Output Signal Q3)

At times t6 to t7, if the output signal Q6 goes to the low level, the PMOS transistor Mp1 goes into the drive state in the level shifter LS3. Thereby, the voltage value of the output signal Q3 starts increasing.

(Stopping of Driving of PMOS Transistor)

At time t7, in the level shifter LS0, the output signal Q3 goes to the high level, so that the PMOS transistor Mp1 goes into the non-drive state. On the other hand, the clock signal P7 rises, so that the NMOS transistor Mn2 goes into the drive state.

(Starting of Driving of Both NMOS Transistors)

At time t8, in the level shifter LS0, the clock signal P0 rises, so that the NMOS transistor Mn1 goes into the drive state. Thereby, both the NMOS transistors Mn1 and Mn2 go into the drive state, so that the voltage value of the output signal Q0 starts decreasing.

Thus, in the level shifter LS0 as an example, during a period in which both the clock signals P0 and P7 are at the high level, there is no period in which the output signal Q3 input to the level shifter LS0 is at the low level. Also, in each of the level shifters LS1 to LS7, a phase relationship between the two clock signals and the output signal is similar to the phase relationship in the level shifter LS0. Specifically, in each of the level shifters LS0 to LS7, at least one of the NMOS transistors Mn1 and Mn2 goes into the non-drive state before the PMOS transistor Mp1 goes into the drive state, and the PMOS transistor Mp1 goes into the non-drive state before both the NMOS transistors Mn1 and Mn2 go into the drive state. In other words, a period Ton(nn) (current extraction period) in which both the NMOS transistors Mn1 and Mn2 are driven and a drive period Ton(p) (current supply period) of the PMOS transistor Mp1 do not overlap each other.

Note that, at time t1 or the like, the timing of transition of the drive state of the NMOS transistor and the timing of transition of the drive state of the PMOS transistor may simultaneously occur.

<Non-Overlapping Conditions>

Figure 16A:
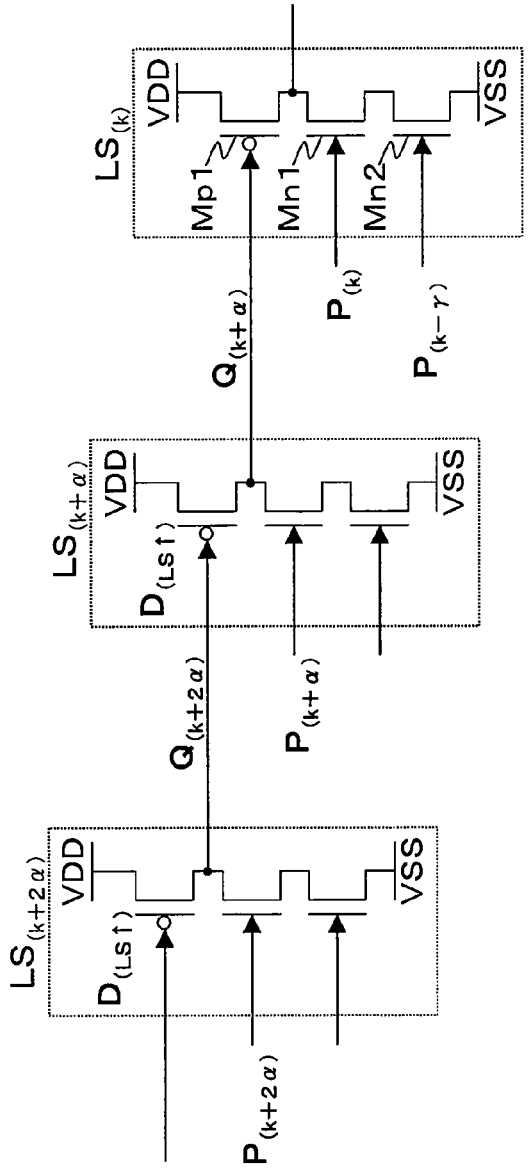
FIG. 16A is a schematic diagram for describing non-overlapping conditions in the multiphase level shift system of the fourth embodiment.
Figure 16B:
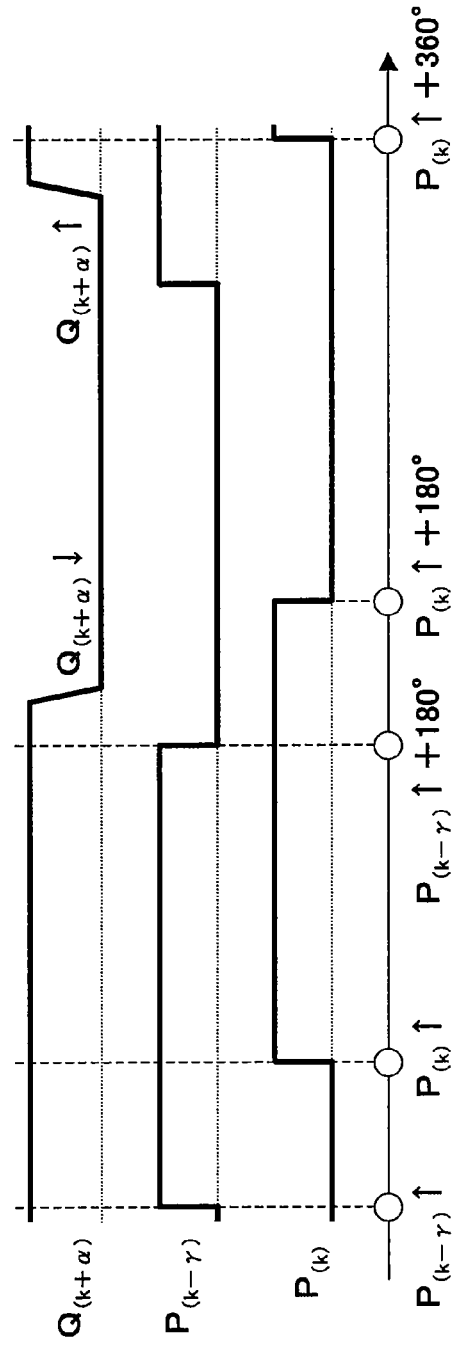
FIG. 16B is a waveform diagram showing a phase relationship between a clock signal and an output signal when the non-overlapping conditions are satisfied.

Next, non-overlapping conditions in this embodiment will be described with reference to FIG. 16. Here, the level shifters $LS_{(k)}$, $LS_{(k+\alpha)}$, and $LS_{(k+2\alpha)}$ will be described as an example. Firstly, symbols used in the following expressions will be described. Note that $P_{(k)}$, $P_{(k+\alpha)}$, $P_{(k+2\alpha)}$, $Q_{(k+\alpha)}$, $Q_{(k+2\alpha)}$, ↑, ↓, $D_{(LS\uparrow)}$, and $D_{(LS\downarrow)}$ are similar to those of FIG. 4.

<<Clock Signals>>

$P_{(k-\gamma)}$: a clock signal having a $(k-\gamma)^{th}$ phase

<<Phase Relationships>>

$$P_{(k-\gamma)}\uparrow < P_{(k)}\uparrow < P_{(k-\gamma)}\downarrow < P_{(k)}\downarrow < (P_{(k)}\uparrow + 360°)$$

$$P_{(k-\gamma)}\downarrow = P_{(k-\gamma)}\uparrow + 180°$$

<<Phase Amount X, Phase Amount Z>>

$$P_{(k+\alpha)}\uparrow - P_{(k)}\uparrow = P_{(k+2\alpha)}\uparrow - P_{(k+\alpha)}\uparrow = X$$

$$P_{(k+2\alpha)}\uparrow - P_{(k)}\uparrow = 2X$$

$$P_{(k+2\alpha)}\uparrow - P_{(k+\alpha)}\uparrow > 0° \Rightarrow X > 0°$$

$$P_{(k)}\uparrow - P_{(k-\gamma)}\uparrow = Z$$

$$P_{(k)}\uparrow < P_{(k-\gamma)}\Rightarrow P_{(k)}\uparrow < P_{(k-\gamma)}\uparrow + 180° \Rightarrow Z < 180°$$

$$P_{(k)}\uparrow - P_{(k-\gamma)}\uparrow > 0° \Rightarrow Z > 0°$$

The phase amount Z which is a phase advance amount of the clock signal $P_{(k-\gamma)}$ with respect to the clock signal $P_{(k)}$ is defined by the above-described expression.

(Drive Period of Transistor)

In the level shifter $LS_{(k)}$, during a period from the rising edge $P_{(k)}\uparrow$ to the falling edge $P_{(k)}\downarrow$ of the clock signal $P_{(k)}$, the NMOS transistor Mn1 is in the drive state. On the other hand, during a period from the rising edge $P_{(k-\gamma)}\uparrow$ to the falling edge $P_{(k-\gamma)}\downarrow$ of the clock signal $P_{(k-\gamma)}$, the NMOS transistor Mn2 is in the drive state.

Since $P_{(k-\gamma)}\uparrow < P_{(k)}\uparrow$, during a period from the rising edge $P_{(k)}\uparrow$ of the clock signal $P_{(k)}$ to the falling edge $P_{(k-\gamma)}\downarrow$ of the clock signal $P_{(k-\gamma)}$, both the clock signals $P_{(k)}$ and $P_{(k-\gamma)}$ are at the high level (e.g., higher than or equal to the threshold voltage of the NMOS transistor), and therefore, both the NMOS transistors Mn1 and Mn2 are in the drive state, so that a current is extracted from the output node to the ground node.

Therefore, in order to satisfy the non-overlapping conditions, the following [Expression 4-1] and [Expression 4-2] need to be satisfied.

$$P_{(k-\gamma)}\downarrow \leq Q_{(k+\alpha)}\downarrow \qquad \text{[Expression 4-1]}$$

$$Q_{(k+\alpha)}\uparrow \leq P_{(k)}\uparrow + 360° \qquad \text{[Expression 4-2]}$$

Specifically, the falling edge $Q_{(k+\alpha)}\downarrow$ of the output signal $Q_{(k+\alpha)}$ occurs subsequent in time to (or simultaneously with) the falling edge $P_{(k-\gamma)}\downarrow$ of the clock signal $P_{(k-\gamma)}$, and the rising edge $Q_{(k+\alpha)}\uparrow$ of the output signal $Q_{(k+\alpha)}$ occurs prior in time to (or simultaneously with) the rising edge $P_{(k)}\uparrow$ of the clock signal $P_{(k)}$.

(Timing of Occurrence of Edge of Output Signal)

In the level shifter $LS_{(k+\alpha)}$, when the rising edge $P_{(k+\alpha)}\uparrow$ of the clock signal $P_{(k+\alpha)}$ occurs, the voltage value of the output signal $Q_{(k+\alpha)}$ starts decreasing. Also, when the falling edge $Q_{(k+2\alpha)}\downarrow$ of the output signal occurs, the voltage value of the output signal $Q_{(k+\alpha)}$ starts increasing. Further, in the level shifter $LS_{(k+2\alpha)}$, when the rising edge $P_{(k+2\alpha)}\uparrow$ of the clock signal $P_{(k+2\alpha)}$ occurs, the voltage value of the output signal $Q_{(k+2\alpha)}$ starts decreasing.

Here, taking into consideration a rising delay amount and a falling delay amount in each level shifter, the falling edge $Q_{(k+\alpha)}\downarrow$ and the rising edge $Q_{(k+\alpha)}\uparrow$ of the output signal $Q_{(k+\alpha)}$ are represented by [Expression 4-3] and [Expression 4-4].

$$Q_{(k+\alpha)}\downarrow = P_{(k+\alpha)}\uparrow + D_{(LS\downarrow)} \qquad \text{[Expression 4-3]}$$

$$Q_{(k+\alpha)}\uparrow = Q_{(k+2\alpha)}\downarrow + D_{(LS\uparrow)} \qquad \text{[Expression 4-4]}$$
$$= P_{(k+2\alpha)}\uparrow + D_{(LS\downarrow)} + D_{(LS\uparrow)}$$

Specifically, the falling edge $Q_{(k+\alpha)}\downarrow$ of the output signal $Q_{(k+\alpha)}$ depends on the timing of occurrence of the rising edge $P_{(k+\alpha)}\uparrow$ of the clock signal $P_{(k+\alpha)}$, and the rising edge of the output signal $Q_{(k+\alpha)}\uparrow$ depends on the timing of occurrence of the rising edge $P_{(k+2\alpha)}\uparrow$ of the clock signal $P_{(k+2\alpha)}$.

(Phase Amount X, Phase Amount Z)

(1) Initially, [Expression 4-3] is substituted into [Expression 4-1].

Also, since $P_{(k-\gamma)}\downarrow = P_{(k-\gamma)}\uparrow + 180°$, $$P_{(k+\alpha)}\uparrow - P_{(k)}\uparrow = X, \text{ and } P_{(k)}\uparrow - P_{(k-\gamma)}\uparrow = Z,$$

$$\text{[Expression 4-1]} \Rightarrow P_{(k-\gamma)}\uparrow + 180° \leq P_{(k+\alpha)}\uparrow + D_{(LS\downarrow)}$$

$$\Rightarrow P_{(k+\alpha)}\uparrow - P_{(k-\gamma)}\uparrow \geq 180° - D_{(LS\downarrow)}$$

$$\Rightarrow X + Z \geq 180° - D_{(LS\downarrow)} \qquad \text{[Expression 4-5]}$$

Thus, [Expression 4-5] is obtained.

(2) Next, [Expression 4-4] is substituted into [Expression 4-2].

Also, since $P_{(k+2\alpha)}\uparrow - P_{(k)}\uparrow = 2X$,

[Expression 4-2] $\Rightarrow P_{(k+2\alpha)}\uparrow + D_{(LS\downarrow)} + D_{(LS\uparrow)} \leq P_{(k)}\uparrow + 360°$ $\Rightarrow P_{(k+2\alpha)}\uparrow - P_{(k)}\uparrow \leq 360° - D_{(LS\downarrow)} - D_{(LS\uparrow)}$ $\Rightarrow 2X \leq 360° - D_{(LS\downarrow)} - D_{(LS\uparrow)}$ $\Rightarrow X \leq 180° - (½) \cdot (D_{(LS\downarrow)} + D_{(LS\uparrow)})$     [Expression 4-6]

Thus, [Expression 4-6] is obtained.

(3) Next, the phase amount X is obtained. Here, since [Expression 4-6] and X>0°, $0° < X \leq 180° - (½) \cdot (D_{(LS\downarrow)} + D_{(LS\uparrow)})$     [Expression 4-7]

Also, since $D_{(LS\downarrow)}, D_{(LS\uparrow)} > 0°$,

[Expression 4-7] $\Rightarrow 0° < X < 180°$     [Expression 4-8]

Thus, [Expression 4-8] and [Expression 4-7] are obtained.

(4) Next, the phase amount Z is obtained. Here, since [Expression 4-5] and Z<180°, $180° - D_{(LS\downarrow)} - X \leq Z < 180°$     [Expression 4-9]

Also, since $D_{(LS\downarrow)} > 0°$, X>0°, and Z>0°,

[Expression 4-9] $\Rightarrow 180° - X < Z < 180°$ $\Rightarrow 0° < Z < 180°$     [Expression 4-10]

Thus, [Expression 4-9] and [Expression 4-10] are obtained.

(5) As described above, if the phase amount X satisfies [Expression 4-7] and the phase amount Z satisfies [Expression 4-9], the non-overlapping conditions can be satisfied. Also, the possible range of the phase amount X is represented by [Expression 4-8], and the possible range of the phase amount Z is as represented by [Expression 4-10]. Specifically, the possible range of the phase amount X and the possible range of the phase amount Z vary depending on the falling delay amount and the rising delay amount of a level shifter, the phase amount X which can satisfy the non-overlapping conditions falls within the range represented by [Expression 4-8], and the phase amount Z falls within the range represented by [Expression 4-10].

<Effect>

As described above, in each level shifter, the overlapping of the current extraction period and the current supply period can be eliminated, so that the occurrence of a through current can be suppressed. Thereby, power consumption in each level shifter can be reduced.

Also, since the current extraction period and the current supply period do not overlap, a delay amount in each level shifter can be reduced. Thereby, the phase precision of the output signal with respect to the clock signal can be improved.

Also, in general, the amplitude of the clock signal is smaller than the amplitude of the output signal, and therefore, power required for charging and discharging an NMOS transistor (charging and discharging power) is smaller than charging and discharging power for a PMOS transistor. In other words, charging and discharging power for the level shifter of FIG. 13 is smaller than charging and discharging power for the level shifter of FIG. 9. Therefore, in this embodiment, power consumption can be further reduced than in the multiphase level shift system of FIG. 9.

Note that, in each level shifter, the clock signals given to the NMOS transistors Mn1 and Mn2 may be switched with the other transistor. For example, in the level shifter LS0, the clock signal P7 may be given to the gate of the NMOS transistor Mn1, and the clock signal P0 may be given to the gate of the NMOS transistor Mn2.

Fifth Embodiment

<Configuration>

Figure 17:
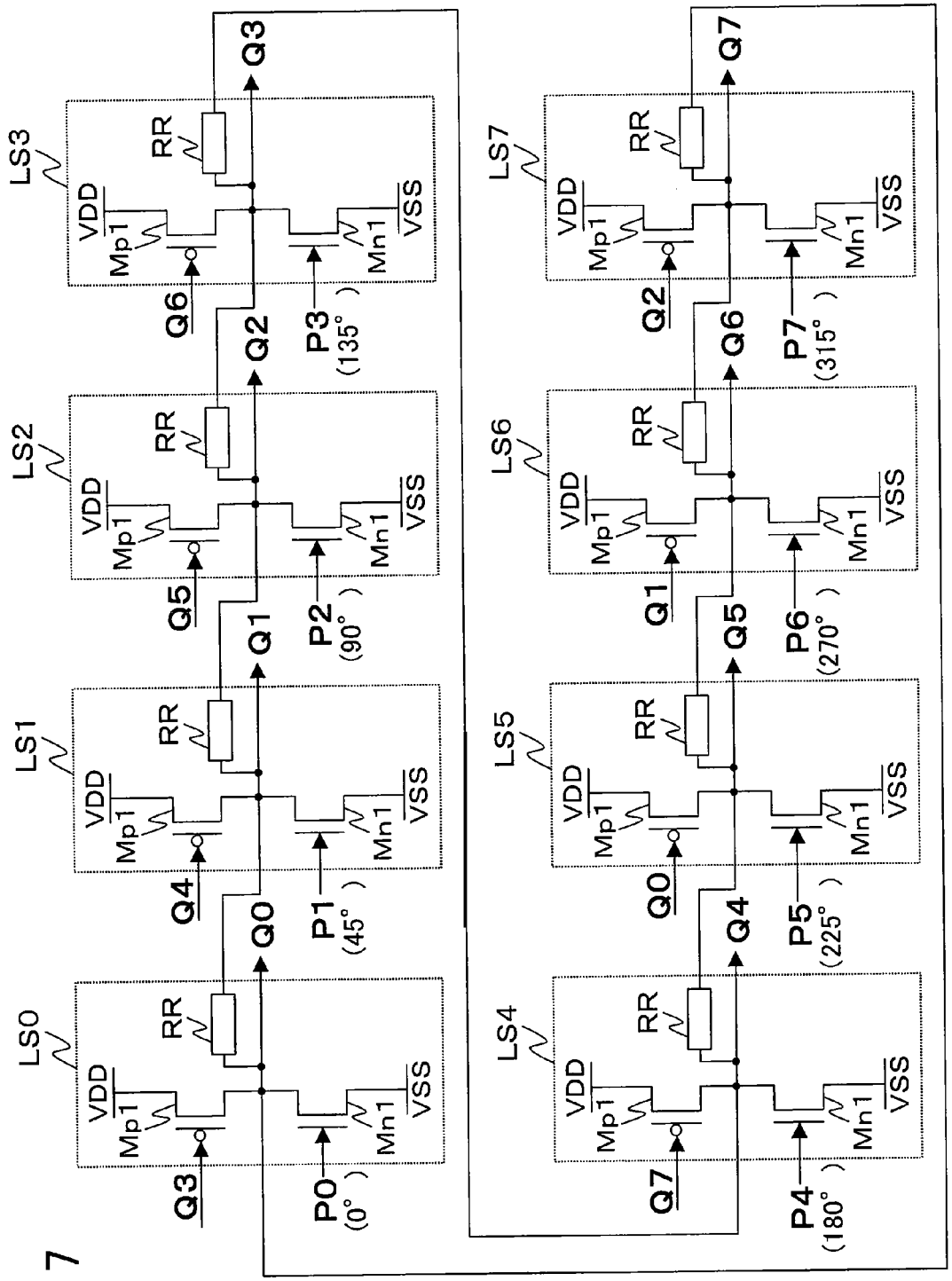
FIG. 17 is a circuit diagram showing an exemplary configuration of a multiphase level shift system according to a fifth embodiment of the present invention.

FIG. 17 shows a configuration of a multiphase level shift system according to a fifth embodiment of the present invention. In this system, level shifters LS0 to LS7 further include a resistance element RR in addition to the NMOS transistor Mn1 and the PMOS transistor Mp1 of FIG. 1.

In each of the level shifters LS0 to LS7, the resistance element RR is connected between an output node (a connection point of the transistors Mn1 and Mp1) of the level shifter, and an output node of a level shifter corresponding to a clock signal whose phase delay amount with respect to a clock signal given to the gate of the NMOS transistor Mn1 of the level shifter is a phase amount T (phase interval). In FIG. 17, T=45° and X=135°.

In other words, in the multiphase level shift system of FIG. 17, the output nodes of the level shifters LS0 to LS7 are connected via a resistor network.

<Resistor Network>

Figure 18:
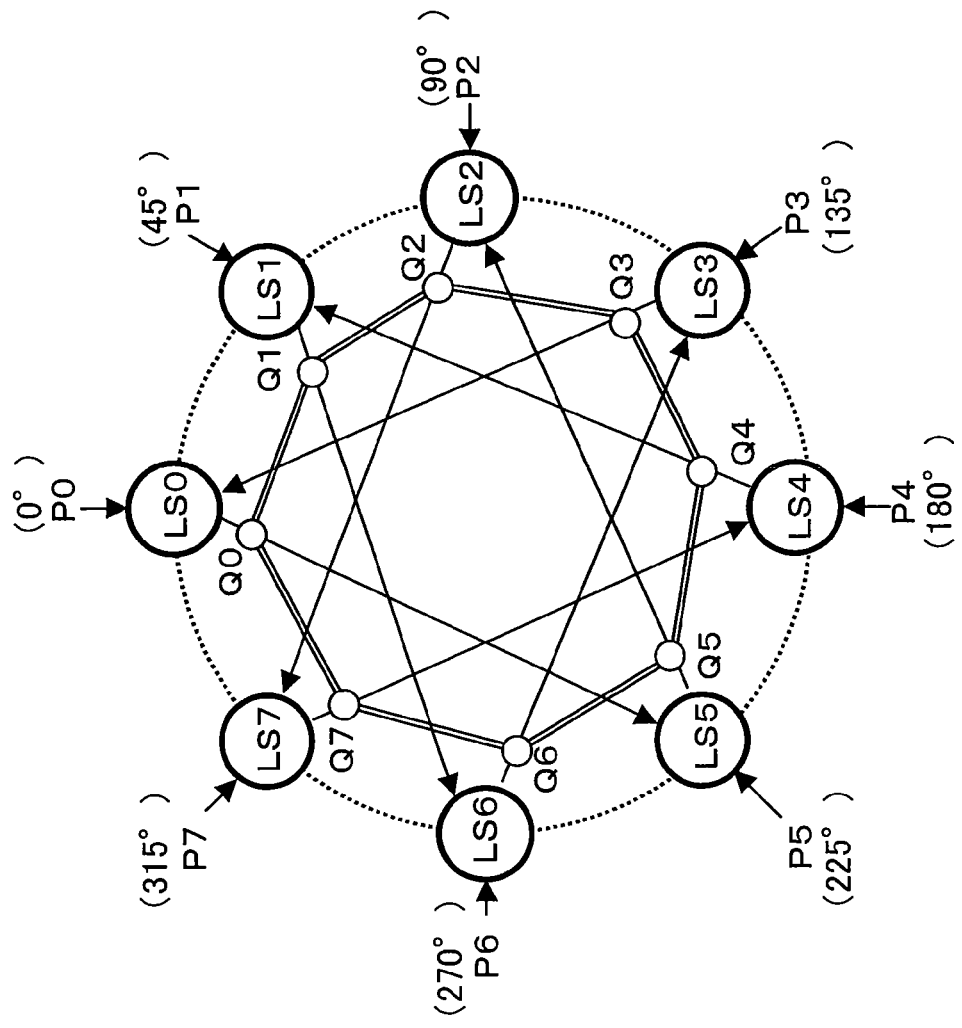
FIG. 18 is a conceptual diagram for describing a resistor network constructed between level shifters of FIG. 17.

FIG. 18 shows a phase relationship between a clock signal given to the NMOS transistor Mn1, an output signal given to the PMOS transistor Mp1, and an output signal connected via the resistance element RR to the output node, in each of the level shifters LS0 to LS7 of FIG. 17.

In a level shifter $LS_{(k)}$ corresponding to a clock signal $P_{(k)}$ having the $k^{th}$ phase, one end of the resistance element RR is connected to the output node of the level shifter $LS_{(k)}$, and the other end of the resistance element RR is connected to the output node of a level shifter $LS_{(k+1)}$. The level shifter $LS_{(k+1)}$ receives a clock signal $P_{(k+1)}$ whose phase is delayed by the phase amount T from the clock signal $P_{(k)}$ given to the level shifter $LS_{(k)}$. Here, when (k+1)>(n−1), (k+1) is a remainder which is left when (k+1) is divided by n. In FIG. 18, n=8, T=45°, and α=135°/45°=3.

<Operation>

Next, an operation of the multiphase level shift system of FIG. 17 will be described. Note that a basic operation is similar to that of the multiphase level shift system of FIG. 1, and therefore, will be described with reference to FIG. 3.

For example, at time t4, output signals Q0, Q1, and Q2 are all in a transition process from the low level to the high level. Here, in the level shifter LS1, if device noise, a device variation or the like occurs, the voltage value or through rate of the output signal Q1 is changed, so that the phase of the output signal Q1 is likely to be deviated from the center between the phase of the output signal Q0 and the phase of the output signal Q2. In the multiphase level shift system of FIG. 17, the output node of the level shifter LS0 is connected via the resistance element RR to the output node of the level shifter LS1, and the output node of the level shifter LS1 is connected via the resistance element RR to the output node of the level shifter LS2, so that a variation in voltage at the output node of the level shifter LS1 (i.e., a variation in voltage of the output signal Q1) is suppressed.

Thus, even if noise or a variation occurs in the level shifter $LS_{(k)}$, the phase of the output signal $Q_{(k)}$ of the level shifter $LS_{(k)}$ can be interpolated using adjacent phases, so that a deterioration in phase precision can be suppressed.

<Effect>

As described above, a phase variation of the output signal in each level shifter is interpolated using adjacent phases, so that the phase precision of the output signal can be further improved.

Note that the resistor network of this embodiment is applicable not only to the first embodiment, but also to the second, third, and fourth embodiments.

Figure 19:
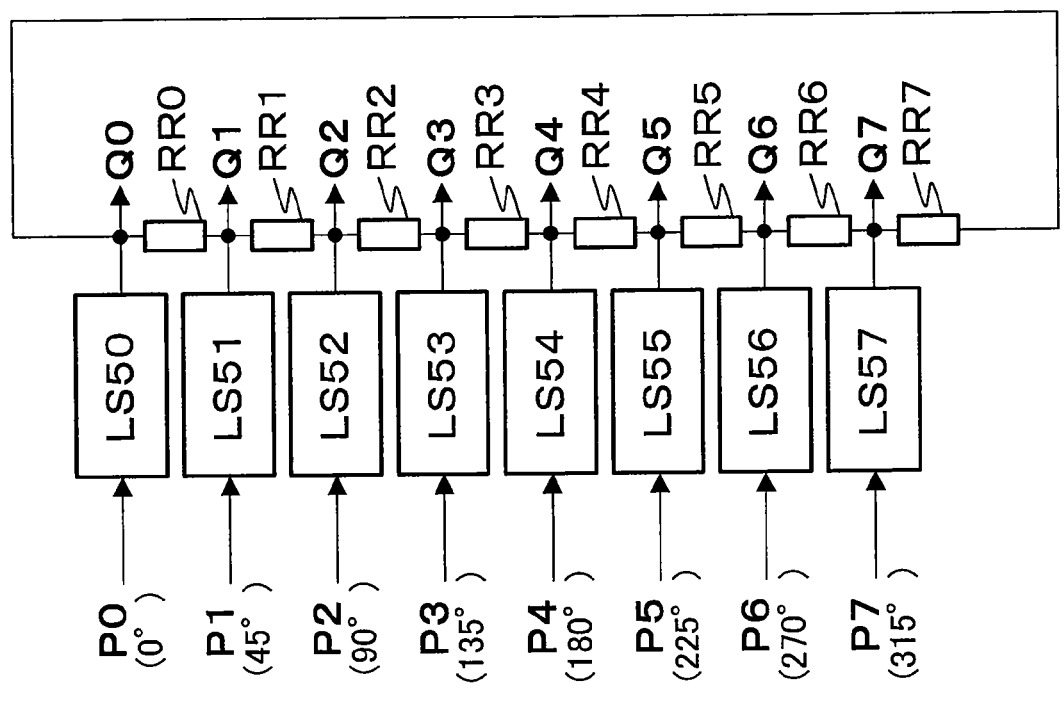
FIG. 19 is a circuit diagram showing a variation of the multiphase level shift system of the fifth embodiment of the present invention.
Figure 21A:
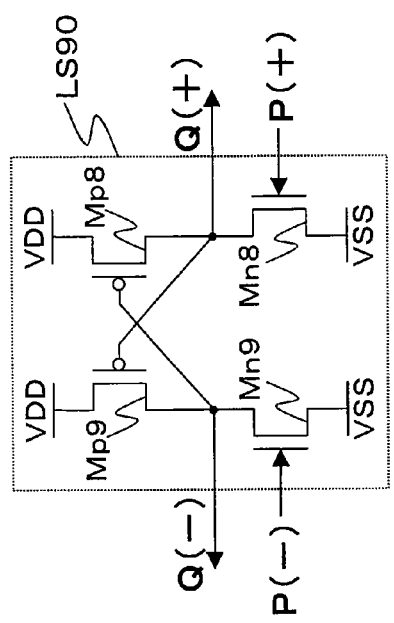
FIG. 21A is a circuit diagram showing a configuration of a conventional level shifter.
Figure 21B:
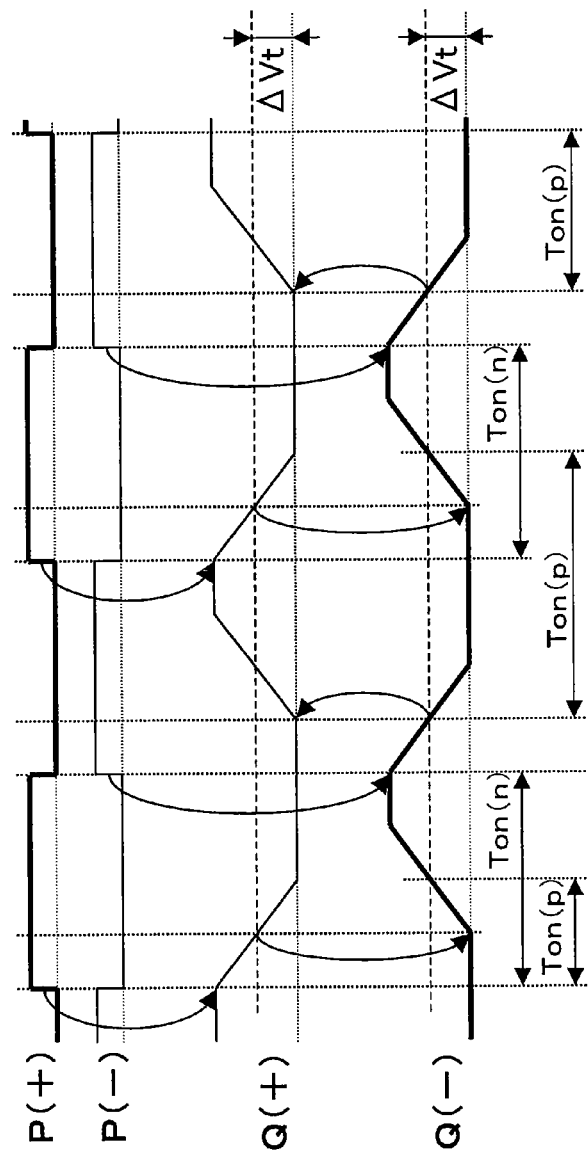
FIG. 21B is a waveform diagram for describing an operation of a level shifter of FIG. 21A.
Figure 22:
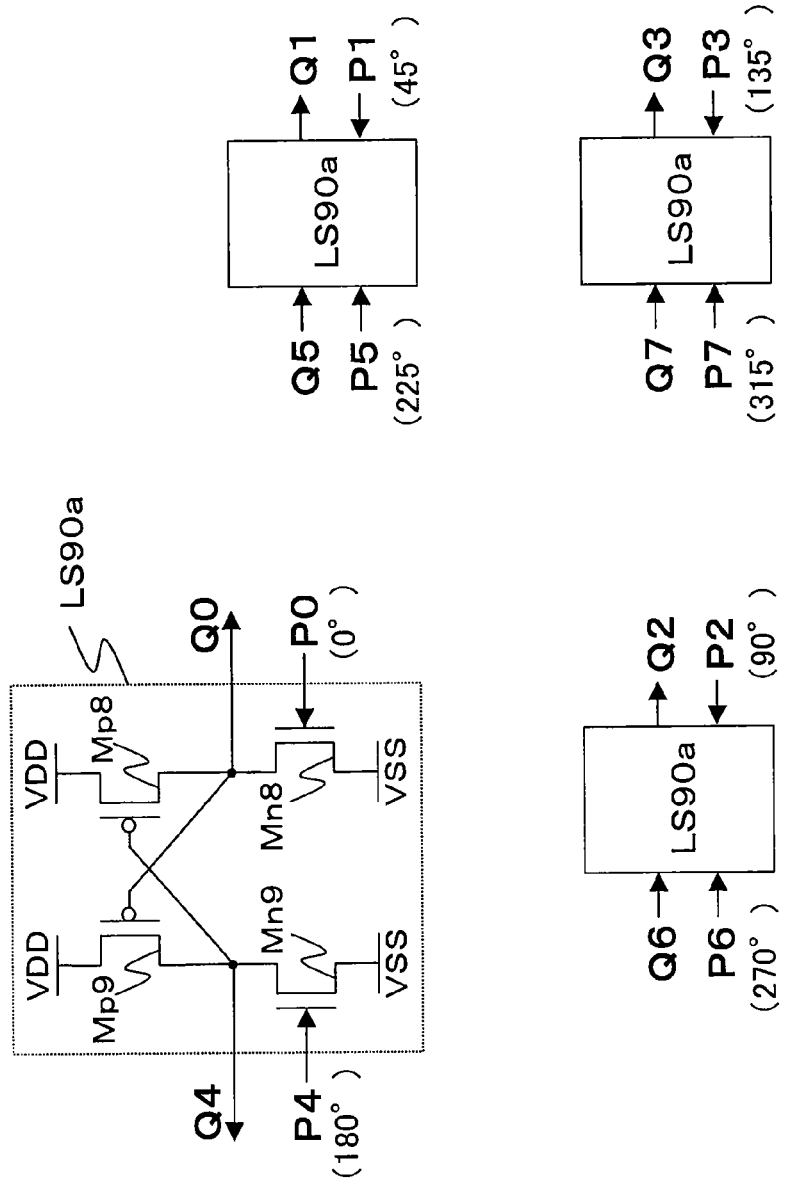
FIG. 22 is a diagram showing a set of level shifters for performing voltage conversion with respect to clock signals having eight phases.
Figure 23A:
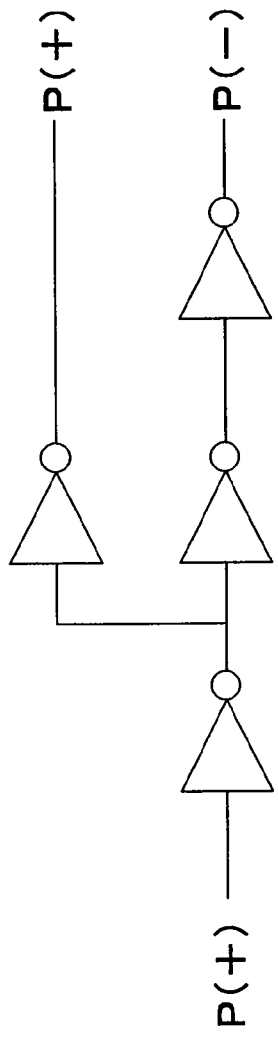
FIG. 23A is a circuit diagram showing a generation circuit for generating inverted clock signals.
Figure 23B:
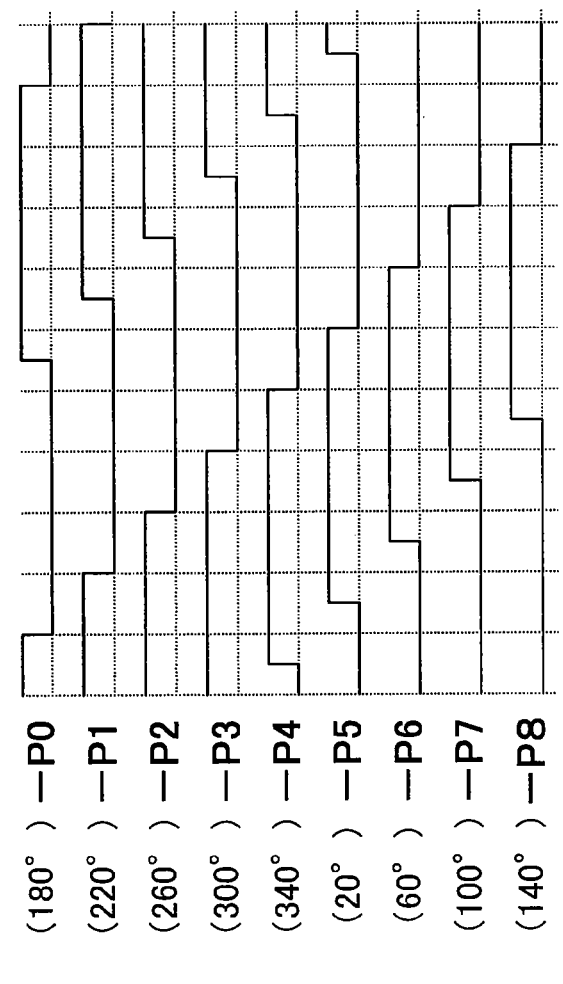
FIG. 23B is a waveform diagram showing inverted clock signals corresponding to clock signals having nine phases.
Figure 24:
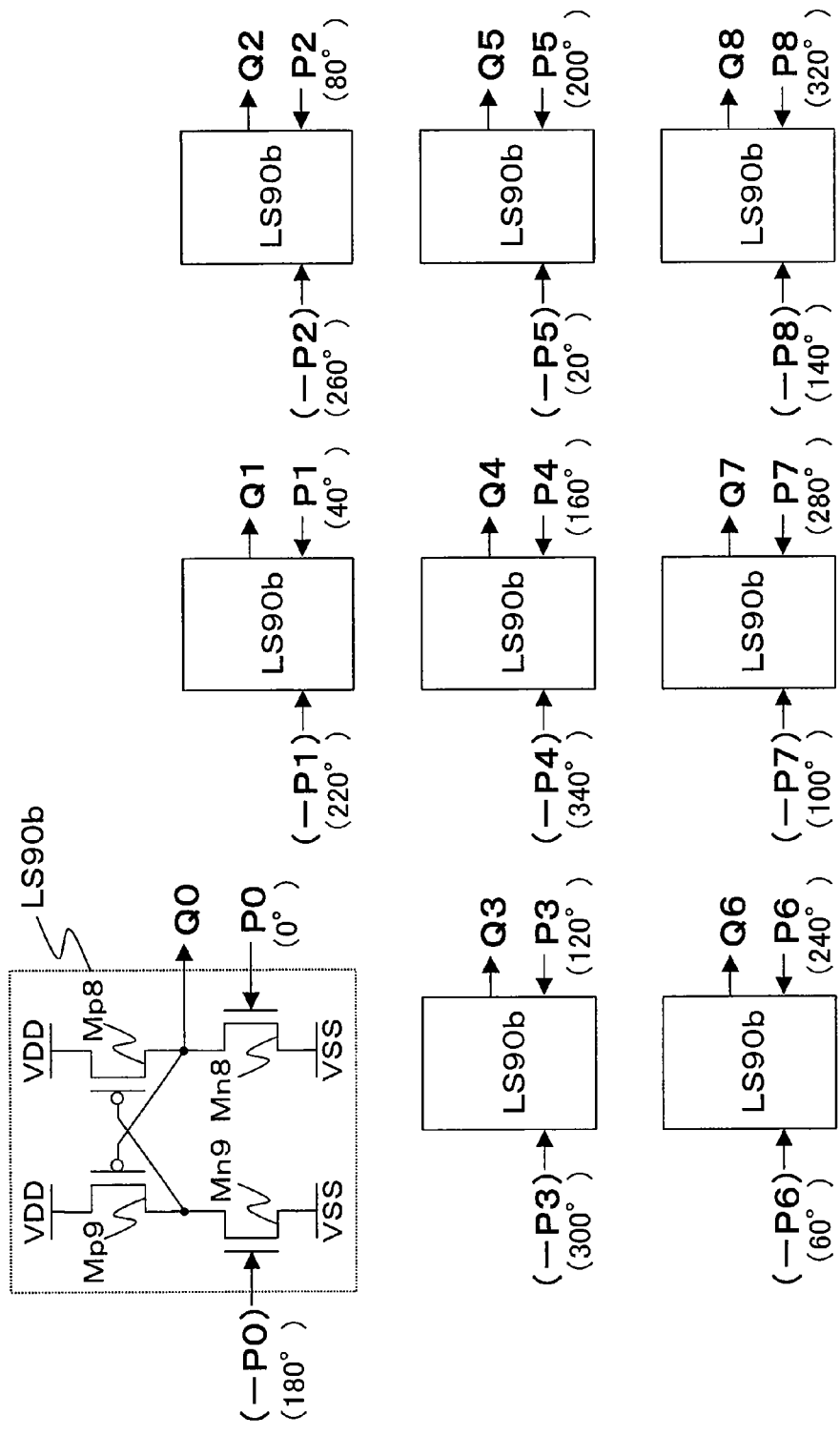
FIG. 24 is a diagram showing a set of level shifters for performing voltage conversion with respect to clock signals having nine phases.

Further, as shown in FIG. 19, the resistor network is also applicable to another multiphase level shift system. The multiphase level shift system of FIG. 19 comprises level shifters LS50 to LS57 corresponding to clock signals P0 to P7, and resistance elements RR0 to RR7 corresponding to the level shifters LS50 to LS57. The level shifters LS50 to LS57 each perform voltage conversion with respect to the corresponding clock signal and output an output signal having a phase corresponding to the clock signal from the output node. In other words, the phase interval of output signals Q0 to Q7 is equal to the phase interval (phase amount T=360°/n) of the clock signals P0 to P7. Also, the level shifters LS50 to LS57 may each have, for example, a configuration as shown in FIG. 22 or FIG. 24, or other configurations. The resistance elements RR0 to RR7 are each connected between the output node of the corresponding level shifter, and the output node of a level shifter having an adjacent phase with respect to that corresponding level shifter (a level shifter corresponding to a clock signal whose phase delay amount with respect to a clock signal corresponding to that corresponding level shifter is the phase amount T (phase interval)). Note that, in FIG. 19, n=8, T=45°. With such a configuration, a phase variation of the output signal of each level shifter is interpolated using adjacent phases, so that the phase precision of the output signal can be further improved.

Other Embodiments

Although eight clock signals (i.e., clock signals having eight phases) are assumed in each of the above-described embodiments, the present invention is also applicable to clock signals having an even number of phases other than eight phases. Also, the larger the number of phases of clock signals, the larger the number of clock signals which can be selected as clock signals $P_{(k+\alpha)}$, $P_{(k+\beta)}$, and $P_{(k-\gamma)}$. For example, in [Expression 1-5], [Expression 1-6], and [Expression 1-8], since $X=T\cdot\alpha$ ($\alpha$ is an integer), $\Rightarrow (1/T)\cdot(180°-D_{(LS\downarrow)}) \leq \alpha$      [Expression 1-5]

$\Rightarrow \alpha \leq (1/T)\cdot(180°-(\frac{1}{2})\cdot(D_{(LS\downarrow)}+D_{(LS\uparrow)}))$      [Expression 1-6]

$\Rightarrow 0°<\alpha<180°/T$      [Expression 1-8]

Specifically, the larger the number of phases of clock signals, the smaller the phase interval (phase amount T) of the clock signals, i.e., the larger the number of clock signals which can be selected as the clock signal $P_{(k+\alpha)}$, so that the multiphase level shift system can be easily constructed.

Also, the multiphase level shift system of each embodiment is applicable not only to an even number of clock signals (i.e., clock signals having an even number of phases), but also to an odd number of clock signals (i.e., clock signals having an odd number of phases). When a multiphase level shift system is applied to clock signals having an odd number of phases, one level shifter including four transistors is required per clock signal in conventional configurations whereas, in the multiphase level shift system of each embodiment, each level shifter includes two or three transistors, so that the circuit scale can be further reduced than in conventional configurations.

Also, regarding the phases of a rising edge and a falling edge of the output signal, for example, timing with which the output signal reaches the threshold voltage ΔVt (or the low level) (i.e., timing with which the PMOS transistor goes from the non-drive state into the drive state) may be the phase of the rising edge of the output signal, and timing with which the output signal reaches the threshold voltage ΔVt (or the low level) (i.e., the PMOS transistor goes from the drive state into the non-drive state) may be the phase of the falling edge of the output signal.

INDUSTRIAL APPLICABILITY

As described above, the multiphase level shift system of the present invention can suppress the occurrence of a through current in a level shifter, and therefore, is useful as, for example, a system for performing voltage conversion with respect to clock signals having multiple phases.

The invention claimed is:

1. A multiphase level shift system for performing voltage conversion with respect to output voltages of n clock signals (n is an integer of three or more) having equal cycles, an interval between phases thereof being a phase amount T (T=360°/n), comprising:
n level shifters in a one-to-one correspondence with the n clock signals,
wherein
each of the n level shifters includes a first NMOS transistor and a first PMOS transistor,
the first NMOS transistor included in each of the n level shifters is connected between an output node for outputting an output signal of said level shifter and a ground node, and a gate of the first NMOS transistor receives the clock signal corresponding to said level shifter,
the first PMOS transistor included in each of the n level shifters is connected between the output node and a power supply node, and a gate of the first PMOS transistor receives an output signal from another level shifter different from said level shifter,
the output signal given to the gate of the first PMOS transistor included in each of the n level shifters is an output signal of the level shifter which receives the clock signal delayed by a phase amount X (0°<X<180°) from the clock signal given to the gate of the first NMOS transistor included in said level shifter, and
the phase amounts X of the n level shifters are equal to each other.

2. The multiphase level shift system of claim 1, wherein
each of the n level shifters further includes a delay element for delaying an output of said level shifter,
a falling delay amount in each of the n level shifter is a phase amount LSf, and a rising delay amount in said level shifter is a phase amount LSr,
a falling delay amount DDf in the delay element included in each of the n level shifters is:
DDf≧180°−LSf−X, and
a rising delay amount DDR in said delay element is:
DDR≦180°−LSr−X.

3. The multiphase level shift system of claim 2, wherein the falling delay amount DDf in the delay element included in each of the n level shifters is larger than the falling delay amount DDR of said delay element.

4. The multiphase level shift system of claim 1, wherein
a falling edge of the output signal given to the gate of the first PMOS transistor included in each of the n level shifters occurs subsequent in time to or simultaneously with a falling edge of the clock signal given to the gate of the first NMOS transistor included in said level shifter, and a rising edge of the output signal given to the gate of said first PMOS transistor occurs prior in time to or simultaneously with a rising edge of said clock signal.

5. The multiphase level shift system of claim 1, wherein
each of the n level shifters further includes a second PMOS transistor,
the second PMOS transistor included in each of the n level shifters and the first PMOS transistor included in said level shifter are connected in series between the power supply node and the output node, and a gate of said second PMOS transistor receives the output signal of another level shifter different from said level shifter,
the output signal given to the gate of the second PMOS transistor included in each of the n level shifters is an output signal of the level shifter corresponding to the clock signal delayed by a phase amount Y (X<Y<360°−X) from the clock signal given to the first NMOS transistor included in said level shifter, and
the phase amounts Y of the n level shifters are equal to each other.

6. The multiphase level shift system of claim 5, wherein
a falling edge of the output signal given to the gate of the second PMOS transistor included in each of the n level shifters occurs subsequent in time to or simultaneously with a falling edge of the clock signal given to the gate of the first NMOS transistor included in said level shifter, and a rising edge of the output signal given to the gate of the first PMOS transistor included in said level shifter occurs prior in time to or simultaneously with a rising edge of said clock signal.

7. The multiphase level shift system of claim 1, wherein
each of the n level shifters further includes a second NMOS transistor,
the second NMOS transistor included in each of the n level shifters and the first NMOS transistor included in said level shifter are connected in series between the ground node and the output node, and a gate of said second NMOS transistor receives a clock signal different from the clock signal given to said first NMOS transistor,
the clock signal given to the second NMOS transistor included in each of the n level shifters is advanced by a phase amount Z (0°<Z<180°) from the clock signal given to the gate of the first NMOS transistor included in said level shifter, and
the phase amounts Z of the n level shifters are equal to each other.

8. The multiphase level shift system of claim 7, wherein
a falling edge of the output signal given to the gate of the first PMOS transistor included in each of the n level shifters occurs subsequent in time to or simultaneously with a falling edge of the clock signal given to the gate of the second NMOS transistor included in said level shifter, and a rising edge of the output signal given to the gate of said first PMOS transistor occurs prior in time to or simultaneously with a rising edge of the clock signal given to the gate of the first NMOS transistor included in said level shifter.

9. The multiphase level shift system of claim 1, wherein
each of the n level shifters further includes a resistance element,
one end of the resistance element included in each of the n level shifters is connected to the output node of said level shifter, and the other end of said resistance element is connected to the output node of another level shifter different from said level shifter, and
the output node connected to the other end of the resistance element included in each of the n level shifters is the output node of the level shifter corresponding to the clock signal delayed by the phase amount T from the clock signal corresponding to said level shifter.

10. A multiphase level shift system for performing voltage conversion with respect to output voltages of n clock signals (n is an integer of three or more) having equal cycles, an interval between phases thereof being a phase amount T (T=360°/n), comprising:
n level shifters in a one-to-one correspondence with the n clock signals; and
n resistance elements in a one-to-one correspondence with the n level shifters,
wherein
each of the n level shifters performs voltage conversion with respect to the clock signal corresponding to said level shifter to generate an output signal corresponding to said clock signal, and outputs said output signal from an output node,
one end of each of the n resistance elements is connected to the output node of the level shifter corresponding to said resistance element, and the other end of said resistance element is connected to the output node of another level shifter different from the level shifter corresponding to said resistance element, and
the output node connected to the other end of each of the n resistance elements is the output node of the level shifter corresponding to the clock signal delayed by the phase amount T from the clock signal corresponding to the level shifter connected to the one end of said resistance element.

11. The multiphase level shift system of claim 3, wherein
a falling edge of the output signal given to the gate of the first PMOS transistor included in each of the n level shifters occurs subsequent in time to or simultaneously with a falling edge of the clock signal given to the gate of the first NMOS transistor included in said level shifter, and a rising edge of the output signal given to the gate of said first PMOS transistor occurs prior in time to or simultaneously with a rising edge of said clock signal.

12. The multiphase level shift system of claim 2, wherein
each of the n level shifters further includes a resistance element,
one end of the resistance element included in each of the n level shifters is connected to the output node of said level shifter, and the other end of said resistance element is connected to the output node of another level shifter different from said level shifter, and
the output node connected to the other end of the resistance element included in each of the n level shifters is the output node of the level shifter corresponding to the clock signal delayed by the phase amount T from the clock signal corresponding to said level shifter.

13. The multiphase level shift system of claim 5, wherein
each of the n level shifters further includes a resistance element,
one end of the resistance element included in each of the n level shifters is connected to the output node of said level shifter, and the other end of said resistance element is connected to the output node of another level shifter different from said level shifter, and
the output node connected to the other end of the resistance element included in each of the n level shifters is the output node of the level shifter corresponding to the clock signal delayed by the phase amount T from the clock signal corresponding to said level shifter.

14. The multiphase level shift system of claim 7, wherein
each of the n level shifters further includes a resistance element,
one end of the resistance element included in each of the n level shifters is connected to the output node of said level shifter, and the other end of said resistance element is connected to the output node of another level shifter different from said level shifter, and the output node connected to the other end of the resistance element included in each of the n level shifters is the output node of the level shifter corresponding to the clock signal delayed by the phase amount T from the clock signal corresponding to said level shifter.

* * * * *